US012609144B2

(12) United States Patent
Yuk et al.

(10) Patent No.: US 12,609,144 B2
(45) Date of Patent: Apr. 21, 2026

(54) SEMICONDUCTOR CHIP AND SEMICONDUCTOR SYSTEM

(71) Applicant: SK hynix Inc., Icheon-si (KR)

(72) Inventors: Young Sub Yuk, Icheon-si (KR); Jae Woo Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 108 days.

(21) Appl. No.: 18/771,703

(22) Filed: Jul. 12, 2024

(65) Prior Publication Data

US 2024/0386926 A1     Nov. 21, 2024

Related U.S. Application Data

(63) Continuation of application No. 17/977,249, filed on Oct. 31, 2022, now Pat. No. 12,068,056.

(30) Foreign Application Priority Data

Jun. 29, 2022     (KR) ........................ 10-2022-0079807

(51) Int. Cl.
*G11C 7/20* (2006.01)
*G01R 19/175* (2006.01)
*G11C 7/22* (2006.01)
*G11C 11/4072* (2006.01)

(52) U.S. Cl.
CPC .............. *G11C 7/20* (2013.01); *G01R 19/175* (2013.01); *G11C 7/22* (2013.01); *G11C 11/4072* (2013.01)

(58) Field of Classification Search
None
See application file for complete search history.

(56) References Cited

U.S. PATENT DOCUMENTS

| | | | |
|---|---|---|---|
| 6,747,440 B2 * | 6/2004 | Weder | .................... G06K 19/07 |
| | | | 323/276 |
| 8,610,472 B2 | 12/2013 | Kang | |
| 9,404,948 B2 | 8/2016 | Hull et al. | |
| 10,090,025 B2 | 10/2018 | Elbaum | |
| 10,719,095 B2 | 7/2020 | Jeong | |

FOREIGN PATENT DOCUMENTS

| | | |
|---|---|---|
| KR | 1020080038954 A | 5/2008 |
| KR | 1020130011799 A | 1/2013 |

* cited by examiner

*Primary Examiner* — Jeffrey S Zweizig
(74) *Attorney, Agent, or Firm* — William Park & Associates Ltd.

(57) ABSTRACT

A semiconductor chip includes a detection circuit configured to generate a discharge signal that is enabled when a voltage level of an external voltage is greater than a first set level and configured to generate a voltage control signal that is enabled when an output voltage is generated to have a voltage level of a ground voltage in a test mode, a charge discharge circuit configured to discharge charges of an output node that is included in a driving circuit when the discharge signal is enabled, and the driving circuit configured to generate the output voltage the voltage level of which rises up to a second set level by supplying charges from the external voltage to the output node in response to a driving signal a voltage level of which is decreased during an interval in which the voltage control signal is enabled.

14 Claims, 18 Drawing Sheets

| VM | SEL<3> | SEL<2> | SEL<1> | TM<2> | TM<1> |
|-----|--------|--------|--------|-------|-------|
| VBG | L | L | H | H | L |
| VOUT | L | H | L | L | H |
| VINT | H | L | L | H | H |

SEMICONDUCTOR CHIP AND SEMICONDUCTOR SYSTEM

CROSS-REFERENCE TO RELATED APPLICATION

The present application is a continuation application of U.S. patent application Ser. No. 17/977,249, filed on Oct. 31, 2022, and claims priority under 35 U.S.C. § 119(a) to Korean application number 10-2022-0079807, filed in the Korean Intellectual Property Office on Jun. 29, 2022, the entire contents of which applications are incorporated herein by reference.

BACKGROUND

1. Technical Field

The present disclosure generally relates to a semiconductor chip and a semiconductor system and, more particularly, a semiconductor chip and a semiconductor system related to providing a test mode in which a power-up operation is repeatedly performed.

2. Related Art

A semiconductor device needs to be supplied with an external voltage from the outside in order for the semiconductor device to operate. A voltage level of the external voltage starts from 0 V and rises up to a target voltage level at a constant slope. In this case, when such an external voltage is directly applied to all the circuits of the semiconductor device, a malfunction occurs in the circuits because the circuits are influenced by the rising external voltage. Accordingly, in order to prevent the malfunction of such a chip, the semiconductor device generates a signal (power-up signal) that is enabled after a power-up interval in which a voltage level of the external voltage rises up to a target set level, and supplies the external voltage to each of the circuits after the power-up signal is enabled and the voltage level of the external voltage becomes a stable voltage level.

Such a semiconductor device generates and uses an internal voltage according to an operation from an external voltage having a high voltage level after a power-up interval. A core voltage that is used in a core area, a bit line precharge voltage for precharging a bit line, a high voltage that is used to drive a word line or used after the start of overdriving, etc. are generated as such an internal voltage.

SUMMARY

In an embodiment, the present disclosure may provide a semiconductor chip including a detection circuit configured to generate a discharge signal that is enabled when a voltage level of an external voltage is greater than a first set level and configured to generate a voltage control signal that is enabled when an output voltage is generated to have a voltage level of a ground voltage in a test mode, a charge discharge circuit configured to discharge charges of an output node that is included in a driving circuit when the discharge signal is enabled, and the driving circuit configured to generate the output voltage the voltage level of which rises up to a second set level by supplying charges from the external voltage to the output node in response to a driving signal a voltage level of which is decreased during an interval in which the voltage control signal is enabled.

Furthermore, in an embodiment, the present disclosure may provide a semiconductor chip including a charge discharge circuit configured to discharge charges of an output node that is included in a driving circuit, in response to a discharge signal that is enabled when a voltage level of an external voltage is greater than a first set level, in a test mode, a driving control circuit configured to generate a driving signal a voltage level of which is decreased based on a voltage control signal that is enabled when an output voltage is generated to have a voltage level identical with a voltage level of a ground voltage and a reference current and configured to generate the driving signal that is disabled by comparing the output voltage and a reference voltage, and the driving circuit configured to generate the output voltage the voltage level of which rises up to a second set level by supplying charges from the external voltage to the output node in response to the driving signal.

Furthermore, in an embodiment, the present disclosure may provide a semiconductor chip including a detection circuit configured to generate a discharge signal that is enabled when a voltage level of an external voltage is greater than a first set level and that is disabled after a set time and configured to generate a voltage control signal that is enabled when an output voltage is generated to have a voltage level of a ground voltage in a test mode, a charge discharge circuit configured to discharge charges of an output node that is included in a driving circuit when the discharge signal is enabled, and the driving circuit configured to generate the output voltage the voltage level of which rises up to a second set level by supplying charges from the external voltage to the output node in response to a driving signal a voltage level of which is decreased during an interval in which the voltage control signal is enabled.

Furthermore, in an embodiment, the present disclosure may provide a semiconductor system including a semiconductor device including a first semiconductor chip configured to generate a bandgap voltage and a second semiconductor chip configured to generate an output voltage and a power-up signal and configured to output any one of the bandgap voltage and the output voltage as a monitoring voltage during an interval in which a power-up signal is enabled as the output voltage is generated to have a voltage level equal to or greater than a set level, and a controller configured to detect normal operations of the first and second semiconductor chips by detecting a voltage level of the monitoring voltage.

BRIEF DESCRIPTION OF THE DRAWINGS

FIG. 4 is a circuit diagram illustrating a construction according to an example of a control signal generation circuit that is included in the level detection circuit illustrated in FIG. 3.

FIG. 6 is a block diagram illustrating a construction according to another example of the level detection circuit that is included in the detection circuit illustrated in FIG. 2.

FIG. 8 is a circuit diagram illustrating a construction according to an example of a timer that is included in the level detection circuit illustrated in FIG. 6.

FIG. 13 is a diagram for describing an operation of a semiconductor chip in a test mode according to an embodiment of the present disclosure.

FIG. 16 is a block diagram illustrating a construction of a semiconductor system according to an embodiment of the present disclosure.

FIG. 17 is a table for describing an operation of the semiconductor system according to an embodiment of the present disclosure.

DETAILED DESCRIPTION

Figure 1:
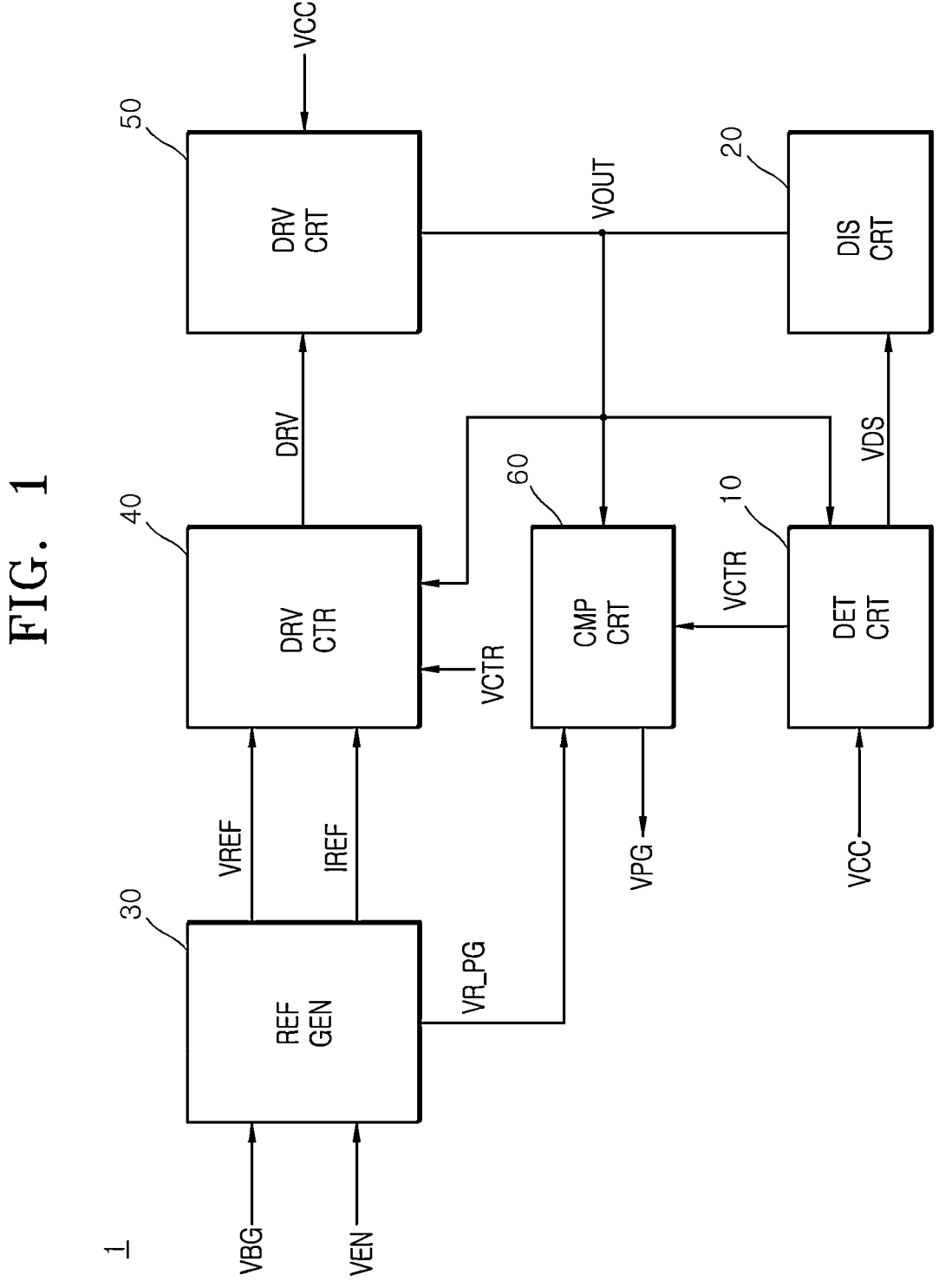
FIG. 1 is a block diagram illustrating a construction of a semiconductor chip according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa. These terms are only used to distinguish one component from another component, but not used to indicate a particular sequence or number of components.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage greater than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the teachings of the present disclosure will be described in more detail through embodiments. The embodiments are only used to exemplify the teachings of the present disclosure, and the scope of the present disclosure is not limited by the embodiments.

The present disclosure, in an embodiment, may provide a semiconductor chip which prevents an error or mitigates errors in the generation of a power-up signal in a way to generate the power-up signal by raising an output voltage after charges of an output node are discharged in a test mode in which a power-up operation is repeatedly performed.

Furthermore, in an embodiment, the present disclosure may provide a semiconductor chip which prevents an error or mitigates errors in the generation of a power-up signal in a way to generate the power-up signal by raising an output voltage after charges of an output node are discharged when a test mode in which a power-up operation is repeatedly performed is performed.

Furthermore, in an embodiment, the present disclosure may provide a semiconductor chip which prevents an error or mitigates errors in the generation of a power-up signal in a way to generate the power-up signal by discharging charges of an output node when a test mode is performed and performing a power-up operation after a set time.

Furthermore, in an embodiment, the present disclosure may provide a semiconductor system which detects normal operations of semiconductor chips by detecting a voltage level of a monitoring voltage that is generated from internal voltages used in a test mode and a normal mode after a power-up signal is generated.

According to the present disclosure, in an embodiment, it is possible to prevent an error or mitigate errors in the generation of a power-up signal because the power-up signal is generated by raising an output voltage after charges of the output node are discharged in a test mode in which a power-up operation is performed.

Furthermore, according to the present disclosure, in an embodiment, it is possible to prevent an error or mitigate errors in the generation of a power-up signal VPG because the power-up signal is generated by raising an output voltage after charges of the output node are discharged when a test mode in which a power-up operation is performed is repeatedly performed.

Furthermore, according to the present disclosure, in an embodiment, it is possible to prevent an error or mitigate errors in the generation of the power-up signal VPG because the power-up signal is generated by discharging charges of the output node when a test mode is performed and performing a power-up operation after a set time.

Furthermore, according to the present disclosure, in an embodiment, there is an effect in that normal operations of semiconductor chips can be detected by detecting a voltage level of a monitoring voltage that is generated from internal voltages used in a test mode and a normal mode after a power-up signal is generated.

As illustrated in FIG. 1, a semiconductor chip 1 according to an embodiment of the present disclosure may include a detection circuit (DET CRT) 10, a charge discharge circuit (DIS CRT) 20, a reference voltage generation circuit (REF GEN) 30, a driving control circuit (DRV CTR) 40, a driving circuit (DRV CRT) 50, and a comparison circuit (CMP CRT) 60.

The detection circuit 10 may generate a discharge signal VDS by detecting a voltage level of an external voltage VCC in a test mode in which a power-up operation is repeatedly performed. The detection circuit 10 may generate the discharge signal VDS that is enabled when a voltage level of the external voltage VCC is greater than a first set level in the test mode. The detection circuit 10 may generate a voltage control signal VCTR by detecting a voltage level of an output voltage VOUT in the test mode in which the power-up operation is performed. The detection circuit 10 may generate the voltage control signal VCTR that is enabled when a voltage level of the output voltage VOUT is generated as a voltage level of a ground voltage VSS in the test mode. The first set level may be set when the voltage level of the external voltage VCC is a voltage level for operating a charge discharge element (21_1 in FIG. 9) included in the charge discharge circuit 20. The test mode may be set as a test mode in which a power-up operation is repeatedly performed. The power-up operation may be set as an operation of the level of the external voltage rising up to a target set level when a semiconductor device and a semiconductor system perform the power-on operation after a power-off operation. The ground voltage VSS may be set as a common ground voltage, but may be set as various voltages each having a voltage level lower than a voltage level of the output voltage VOUT in a different embodiment.

The charge discharge circuit 20 may decrease a voltage level of the output voltage VOUT during the interval in which the discharge signal VDS is enabled. The charge discharge circuit 20 may discharge the charges of an output node (nd51 in FIGS. 9 and 12) that is included in the driving circuit 50 during the interval in which the discharge signal VDS is enabled. The output node (nd51 in FIGS. 9 and 12) may be set as an internal node from which the output voltage VOUT is output.

After the test mode is entered, the reference voltage generation circuit 30 may generate a reference voltage VREF, a reference current IREF, and a power reference voltage VR_PG based on a bandgap voltage VBG during the interval in which an enable signal VEN is enabled. The bandgap voltage VBG may be set as a voltage having a constant voltage level. The bandgap voltage VBG may be set as a voltage that is generated by a common bandgap voltage generator. Each of the reference voltage VREF and the power reference voltage VR_PG may be set as a voltage having a constant voltage level. The reference current IREF may be set as a current having a constant amount of current. The reference voltage VREF, the power reference voltage VR_PG, and the reference current IREF may be set as voltages that are generated by a common reference voltage generator. The enable signal VEN may be set as a signal that is enabled to a logic high level after the test mode is entered.

The driving control circuit 40 may generate a driving signal DRV the voltage level of which is decreased, based on the reference voltage VREF or the reference current IREF, during the interval in which the voltage control signal VCTR is enabled. The driving control circuit 40 may generate the driving signal DRV by comparing the output voltage VOUT and the reference voltage VREF.

The driving circuit 50 may generate the output voltage VOUT by supplying charges from the external voltage VCC to the output node (nd51 in FIGS. 9 and 12) in response to the driving signal DRV. The driving circuit 50 may additionally increase the charges that are supplied from the external voltage VCC to the output node (nd51 in FIGS. 9 and 12), as the voltage level of the driving signal DRV is decreased. The driving circuit 50 may generate the output voltage VOUT the voltage level of which rises up to a second set level by supplying the charges from the external voltage VCC to the output node (nd51 in FIGS. 9 and 12) based on a voltage level of the driving signal DRV. The driving circuit 50 may block the charges that are supplied from the external voltage VCC to the output node (nd51 in FIGS. 9 and 12) during the interval in which the driving signal DRV is disabled. The second set level may be set as a voltage level of the power reference voltage VR_PG.

The comparison circuit 60 may generate a power-up signal VPG by comparing the output voltage VOUT and the power reference voltage VR_PG during the interval in which a voltage control signal VCTR is enabled. The comparison circuit 60 may generate the power-up signal VPG that is enabled when the output voltage VOUT is generated to have a voltage level equal to or greater than a voltage level of the power reference voltage VR_PG during the interval in which the voltage control signal VCTR is enabled. The comparison circuit 60 may generate the power-up signal VPG that is disabled when the output voltage VOUT is generated to have a lower voltage level than a voltage level of the power reference voltage VR_PG during the interval in which the voltage control signal VCTR is enabled.

Such a semiconductor chip 1 according to an embodiment of the present disclosure can prevent an error or mitigate errors in the generation of the power-up signal VPG because the semiconductor chip 1 generates the power-up signal VPG by raising the output voltage VOUT after discharging charges of the output node in the test mode in which a power-up operation is repeatedly performed. The semiconductor chip 1 according to an embodiment of the present disclosure can prevent an error or mitigate errors in the generation of the power-up signal VPG because the semiconductor chip 1 generates the power-up signal VPG by raising the output voltage VOUT after discharging charges of the output node when the test mode in which a power-up operation is repeatedly performed is performed.

Figure 2:
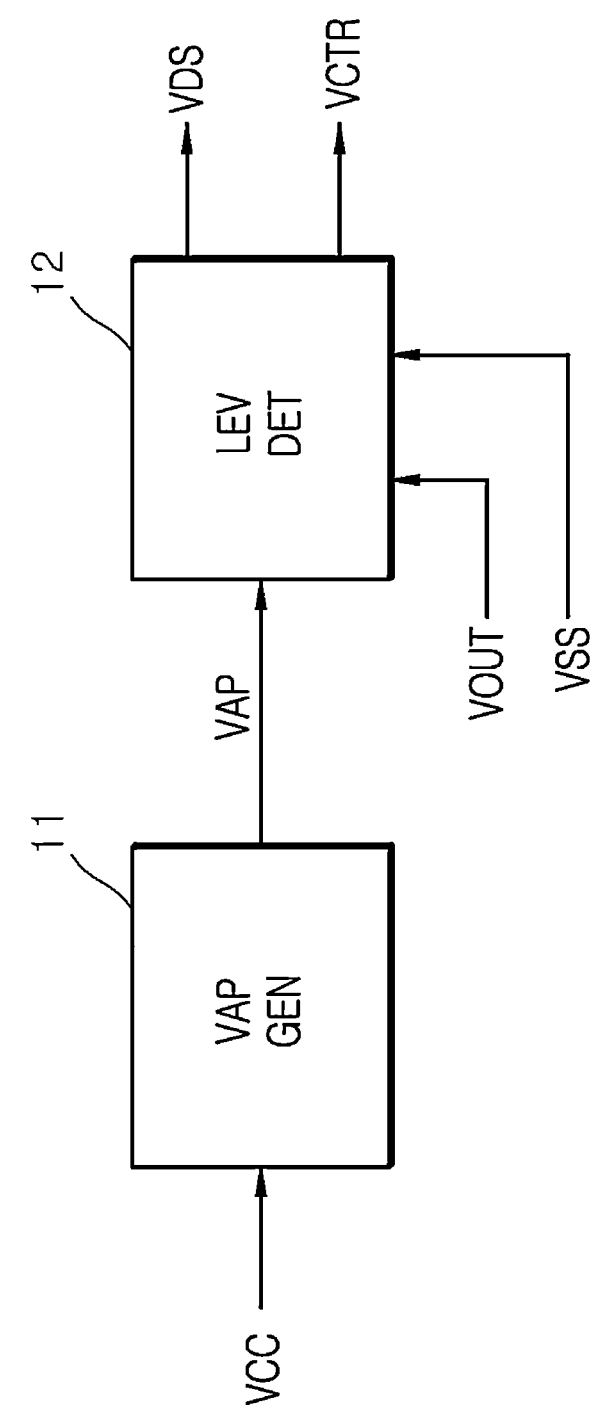
FIG. 2 is a block diagram illustrating a construction according to an example of a detection circuit that is included in the semiconductor chip illustrated in FIG. 1.

FIG. 2 is a block diagram illustrating a construction according to an example of the detection circuit 10 that is included in the semiconductor chip 1. The detection circuit 10 may include an external voltage detection signal generation circuit (VAP GEN) 11 and a level detection circuit (LEV DET) 12.

The external voltage detection signal generation circuit 11 may generate an external voltage detection signal VAP by detecting a voltage level of the external voltage VCC. The external voltage detection signal generation circuit 11 may generate the external voltage detection signal VAP that is enabled when a voltage level of the external voltage VCC is greater than a first set level. The first set level may be set when the voltage level of the external voltage VCC is a voltage level for operating a charge discharge element (21_1 in FIG. 9) included in the charge discharge circuit 20.

The level detection circuit 12 may generate the discharge signal VDS based on the external detection signal VAP. The level detection circuit 12 may generate the discharge signal VDS that is enabled during the interval in which the external detection signal VAP is enabled. The level detection circuit 12 may generate the voltage control signal VCTR by detecting a voltage level of the output voltage VOUT. The level detection circuit 12 may generate the voltage control signal VCTR that is enabled when the output voltage VOUT is generated to have a voltage level of the ground voltage VSS.

Figure 3:
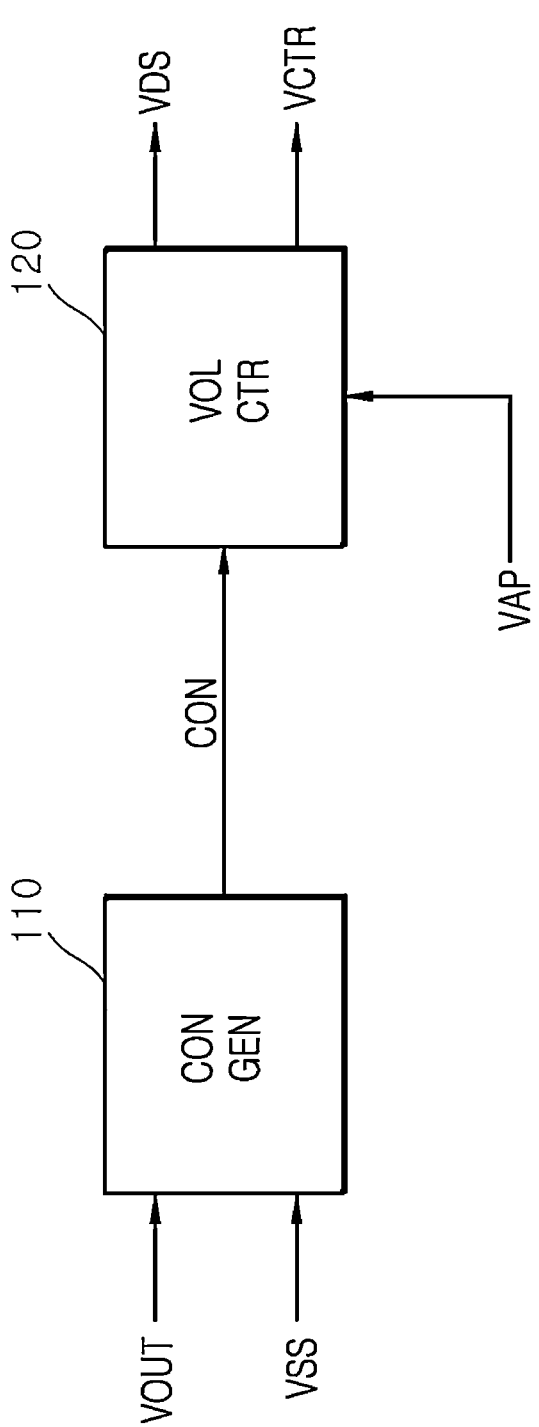
FIG. 3 is a block diagram illustrating a construction according to an example of a level detection circuit that is included in the detection circuit illustrated in FIG. 2.

FIG. 3 is a block diagram illustrating a construction according to an example of the level detection circuit 12 that is included in the detection circuit 10. The level detection circuit 12 may include a control signal generation circuit (CON GEN) 110 and a voltage generation control circuit (VOL CTR) 120.

The control signal generation circuit 110 may generate a control signal CON by comparing voltage levels of the output voltage VOUT and the ground voltage VSS. The control signal generation circuit 110 may generate the control signal CON that is enabled when the output voltage VOUT is generated to have a voltage level of the ground voltage VSS. The control signal generation circuit 110 may generate the control signal CON that is disabled when a voltage level of the output voltage VOUT is greater than a voltage level of the ground voltage VSS.

The voltage generation control circuit 120 may generate the discharge signal VDS based on the external detection signal VAP. The voltage generation control circuit 120 may generate the discharge signal VDS that is enabled during the interval in which the external detection signal VAP is enabled. The voltage generation control circuit 120 may generate the voltage control signal VCTR based on the control signal CON. The voltage generation control circuit 120 may generate the voltage control signal VCTR that is enabled during the interval in which the control signal CON is enabled.

Figure 4:
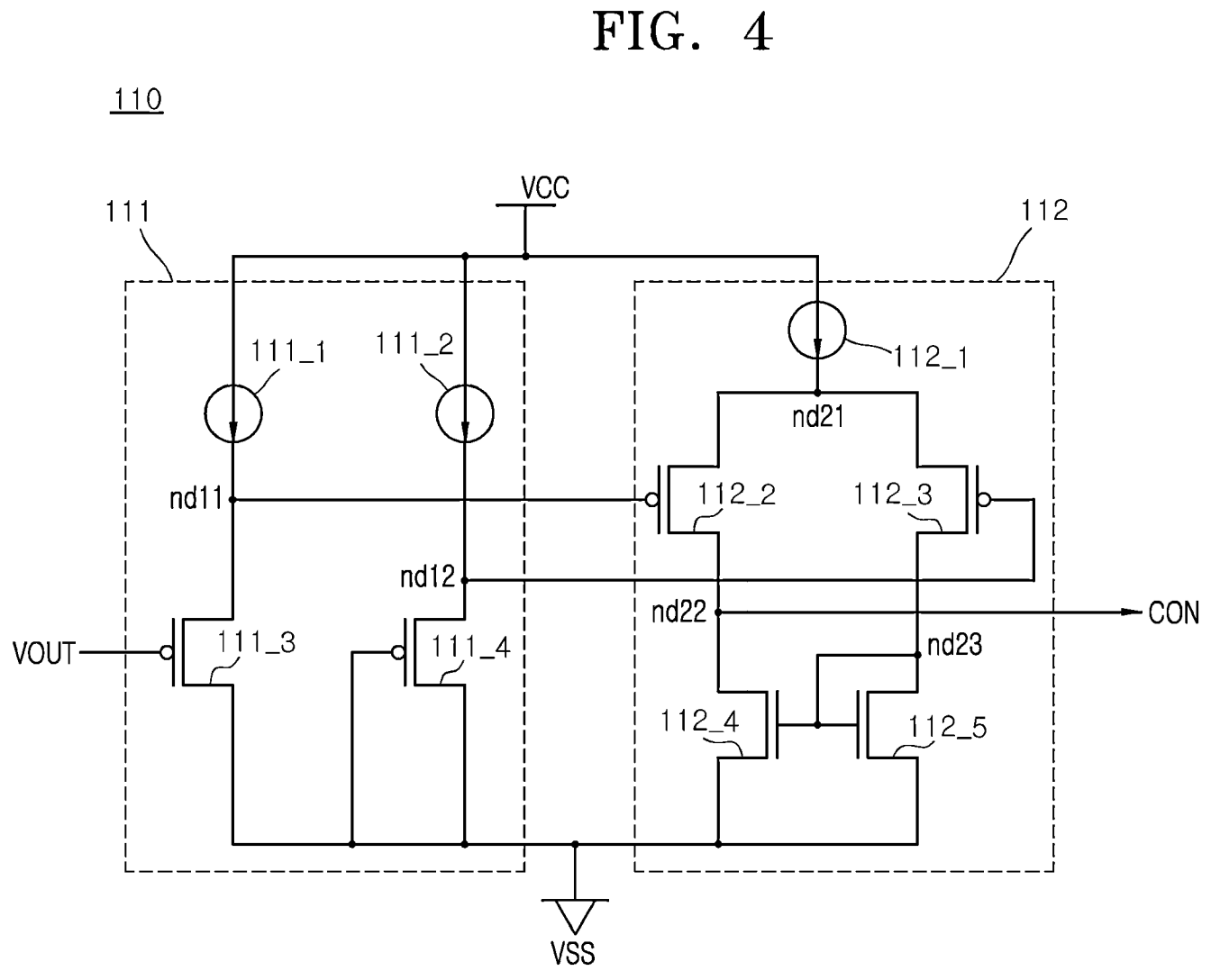

FIG. 4 is a circuit diagram illustrating a construction according to an example of the control signal generation circuit 110 that is included in the level detection circuit 12. The control signal generation circuit 110 may include a current supply circuit 111 and a charge comparison circuit 112.

The current supply circuit 111 may include a first current source 111_1 that is connected between the external voltage VCC and a first node nd11, a second current source 111_2 that is connected between the external voltage VCC and a second node nd12, a first PMOS transistor 111_3 that is connected between the first node nd11 and the ground voltage VSS and that discharges the charges of the first node nd11 by having its driving force adjusted based on a voltage level of the output voltage VOUT, and a second PMOS transistor 111_4 that is connected between the second node nd12 and the ground voltage VSS and that discharges the charges of the second node nd12 by the ground voltage VSS.

A difference between the driving forces of the first PMOS transistor 111_3 and the second PMOS transistor 111_4 that are included in the current supply circuit 111 may be set as K:1. The difference K:1 between the driving forces may mean that when the driving force of the second PMOS transistor 111_4 is 1, the driving force of the first PMOS transistor 111_3 is set as a driving force that is K times the driving force of the second PMOS transistor 111_4. A difference between the driving forces of the first PMOS transistor 111_3 and the second PMOS transistor 111_4 may be variously set in different embodiments. K may be set as a natural number.

The charge comparison circuit 112 may include a third current source 112_1 that is connected between the external voltage VCC and a third node nd21, a third PMOS transistor 112_2 that is connected between the third node nd21 and a fourth node nd22 and that discharges the charges of the third node nd21 based on a voltage level of the first node nd11, a fourth PMOS transistor 112_3 that is connected between the third node nd21 and a fifth node nd23 and that discharges the charges of the third node nd21 based on a voltage level of the second node nd12, a first NMOS transistor 112_4 that is connected between the fourth node nd22 and the ground voltage VSS and that has a gate connected to the fifth node nd23, and a second NMOS transistor 112_5 that is connected between the fifth node nd23 and the ground voltage VSS and that has a gate connected to the fifth node nd23.

A difference between the driving forces of the third PMOS transistor 112_2 and the fourth PMOS transistor 112_3 that are included in the charge comparison circuit 112 may be set as N:1. The difference N: 1 between the driving forces may mean that when the driving force of the fourth PMOS transistor 112_3 is 1, the driving force of the third PMOS transistor 112_2 is set as a driving force that is N times the driving force of the fourth PMOS transistor 112_3. A difference between the driving forces of the third PMOS transistor 112_2 and the fourth PMOS transistor 112_3 may be variously set in different embodiments. N may be set as a natural number.

An operation of discharging, by the current supply circuit 111, the charges of the first node nd11 and the second node nd12 and an operation of generating, by the charge comparison circuit 112, the control signal CON by comparing the amounts of charges of the first node nd11 and the second node nd12 are described as follows with reference to FIG. 4.

First, a case in which the output voltage VOUT is generated to have a greater voltage level than the ground voltage VSS is described as follows.

When the current supply circuit 111 generates the output voltage VOUT having a greater voltage level than the ground voltage VSS, the driving force of the second PMOS transistor 111_4 is set to be greater than the driving force of the first PMOS transistor 111_3, and thus the charges of the second node nd12 may be more discharged or may be discharged quicker with the greater driving force. Accordingly, a voltage level of the second node nd12 may be set to be lower than a voltage level of the first node nd11.

When the charges of the second node nd12 are additionally discharged and the voltage level of the second node nd12 is set to be lower than the voltage level of the first node nd11, the amount of charges of the fifth node nd23 may be gradually increased. Accordingly, the charge comparison circuit 112 may generate the control signal CON having a logic low level because the charges of the fourth node nd22 are discharged through the first NMOS transistor 112_4.

Next, a case in which the output voltage VOUT is generated to have a voltage level of the ground voltage VSS is described as follows.

When the current supply circuit 111 generates the output voltage VOUT having a voltage level of the ground voltage VSS, the driving force of the first PMOS transistor 111_3 may be set as a driving force that is K times the driving force of the second PMOS transistor 111_4, and thus the charges of the first node nd11 may be discharged to a lower voltage level. Accordingly, a voltage level of the first node nd11 may be set to be lower than a voltage level of the second node nd12.

When the charges of the first node nd11 are discharged with a greater driving force and the voltage level of the first node nd11 is set to be lower than the voltage level of the second node nd12, the charge comparison circuit 112 generates the control signal CON having a logic high level because the amount of charges of the fourth node nd22 is gradually increased through the third PMOS transistor 112_2.

Figure 5:
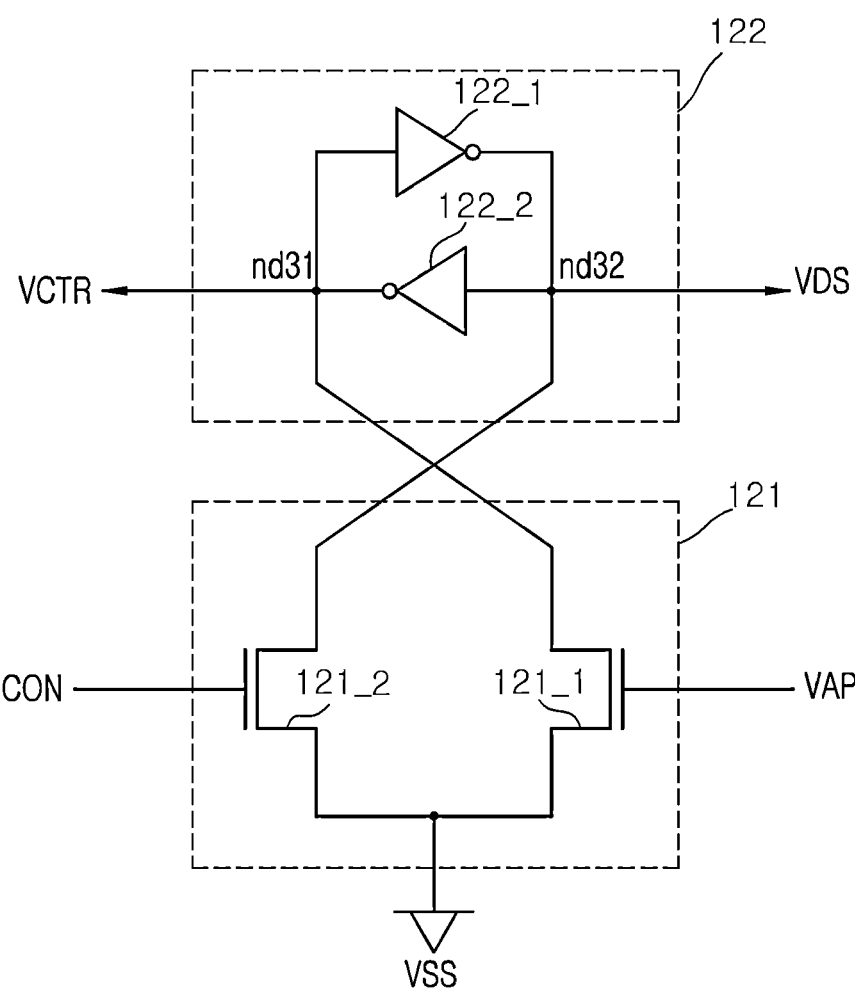
FIG. 5 is a circuit diagram illustrating a construction according to an example of a voltage generation control circuit that is included in the level detection circuit illustrated in FIG. 3.

FIG. 5 is a circuit diagram illustrating a construction according to an example of the voltage generation control circuit 120 that is included in the level detection circuit 12. The voltage generation control circuit 120 may include a pull-down driving circuit 121 and a latch circuit 122.

The pull-down driving circuit 121 may include a third NMOS transistor 121_1 that is connected between a sixth node nd31 and the ground voltage VSS and that discharges the charges of the sixth node nd31 when the external detection signal VAP is enabled and a fourth NMOS transistor 121_2 that is connected between a seventh node nd32 and the ground voltage VSS and that discharges the charges of the seventh node nd32 when the control signal CON is enabled.

The latch circuit 122 may include a first inverter 122_1 that is connected between the sixth node nd31 and the seventh node nd32 and that generates the discharge signal VDS by inverting a voltage level of the sixth node nd31 and a second inverter 122_2 that is connected between the sixth node nd31 and the seventh node nd32 and that generates the voltage control signal VCTR by inverting a voltage level of the seventh node nd32.

An operation of generating, by the voltage generation control circuit 120, the discharge signal VDS based on the external detection signal VAP and an operation of generating, by the voltage generation control circuit 120, the voltage control signal VCTR based on the control signal CON are described as follows with reference to FIG. 5.

First, the operation of generating the discharge signal VDS based on the external detection signal VAP is described as follows.

In the pull-down driving circuit 121, the third NMOS transistor 121_1 may be turned on when the external detection signal VAP is enabled to a logic high level, and may discharge the charges of the sixth node nd31.

The latch circuit 122 may generate the discharge signal VDS that is enabled to a logic high level by inverting a voltage level of the sixth node nd31.

Next, the operation of generating the voltage control signal VCTR based on the control signal CON is described as follows.

In the pull-down driving circuit 121, the fourth NMOS transistor 121_2 may be turned on when the control signal CON is enabled to a logic high level, and may discharge the charges of the seventh node nd32.

The latch circuit 122 may generate the voltage control signal VCTR that is enabled to a logic high level by inverting a voltage level of the seventh node nd32.

Figure 6:
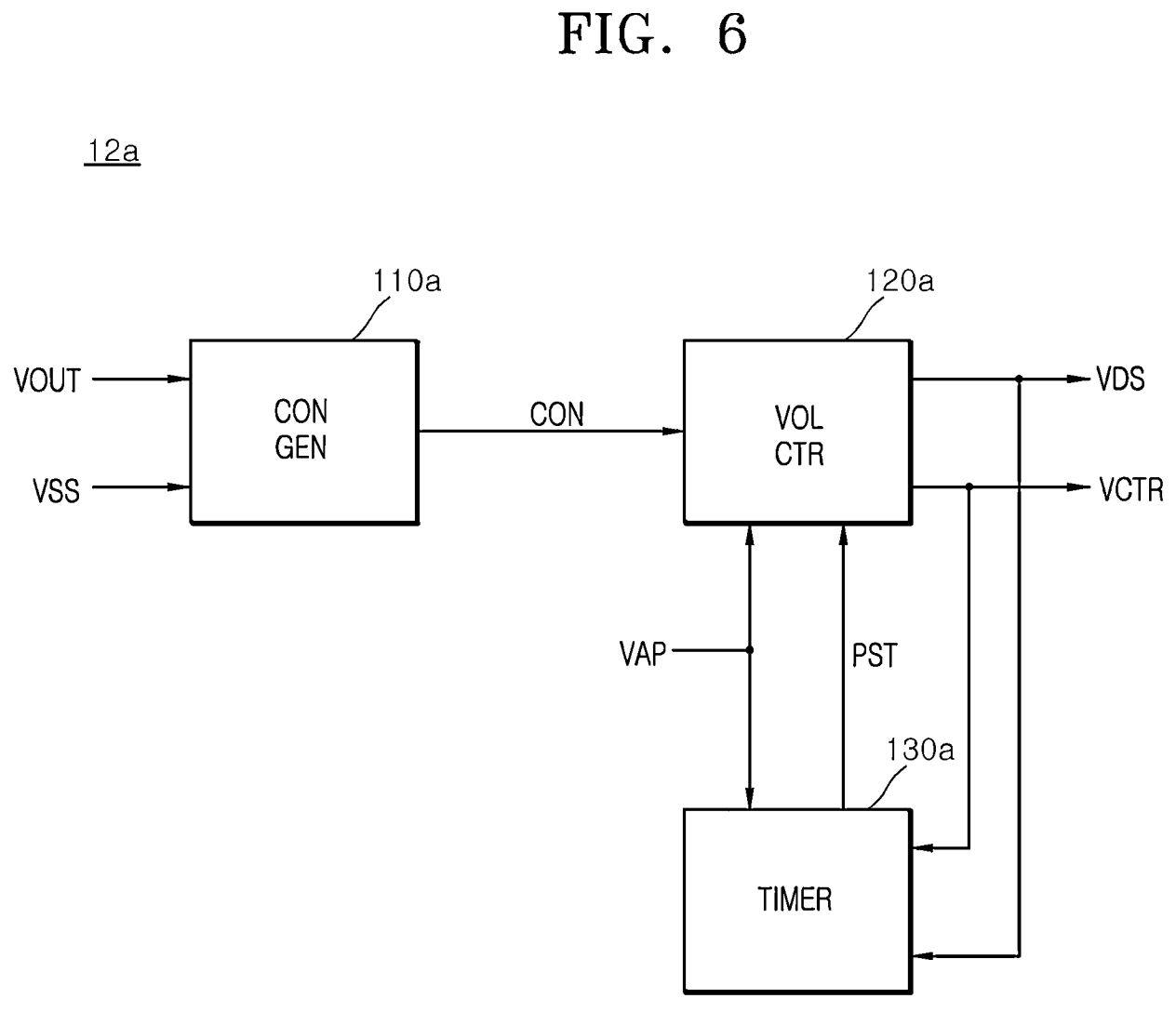

FIG. 6 is a block diagram illustrating a construction according to another example of the level detection circuit 12 that is included in the detection circuit 10. A level detection circuit 12a may include a control signal generation circuit (CON GEN) 110a, a voltage generation control circuit (VOL CTR) 120a, and a timer 130a.

The control signal generation circuit 110a may generate the control signal CON by comparing voltage levels of the output voltage VOUT and the ground voltage VSS. The control signal generation circuit 110a may generate the control signal CON that is enabled when the output voltage VOUT is generated to have a voltage level of the ground voltage VSS. The control signal generation circuit 110a may generate the control signal CON that is disabled when a voltage level of the output voltage VOUT is greater than a voltage level of the ground voltage VSS. The control signal generation circuit 110a may be implemented as the same circuit as the control signal generation circuit 110 illustrated in FIG. 4, and may perform the same operation as the control signal generation circuit 110, and thus a detailed description thereof is omitted.

The voltage generation control circuit 120a may generate the discharge signal VDS based on the external detection signal VAP. The voltage generation control circuit 120a may generate the discharge signal VDS that is enabled during the interval in which the external detection signal VAP is enabled. The voltage generation control circuit 120a may generate the voltage control signal VCTR based on the control signal CON. The voltage generation control circuit 120a may generate the voltage control signal VCTR that is enabled during the interval in which the control signal CON is enabled. The voltage generation control circuit 120a may generate the voltage control signal VCTR based on a power-up start signal PST. The voltage generation control circuit 120a may generate the voltage control signal VCTR that is enabled during the interval in which the power-up start signal PST is enabled.

Figure 8:
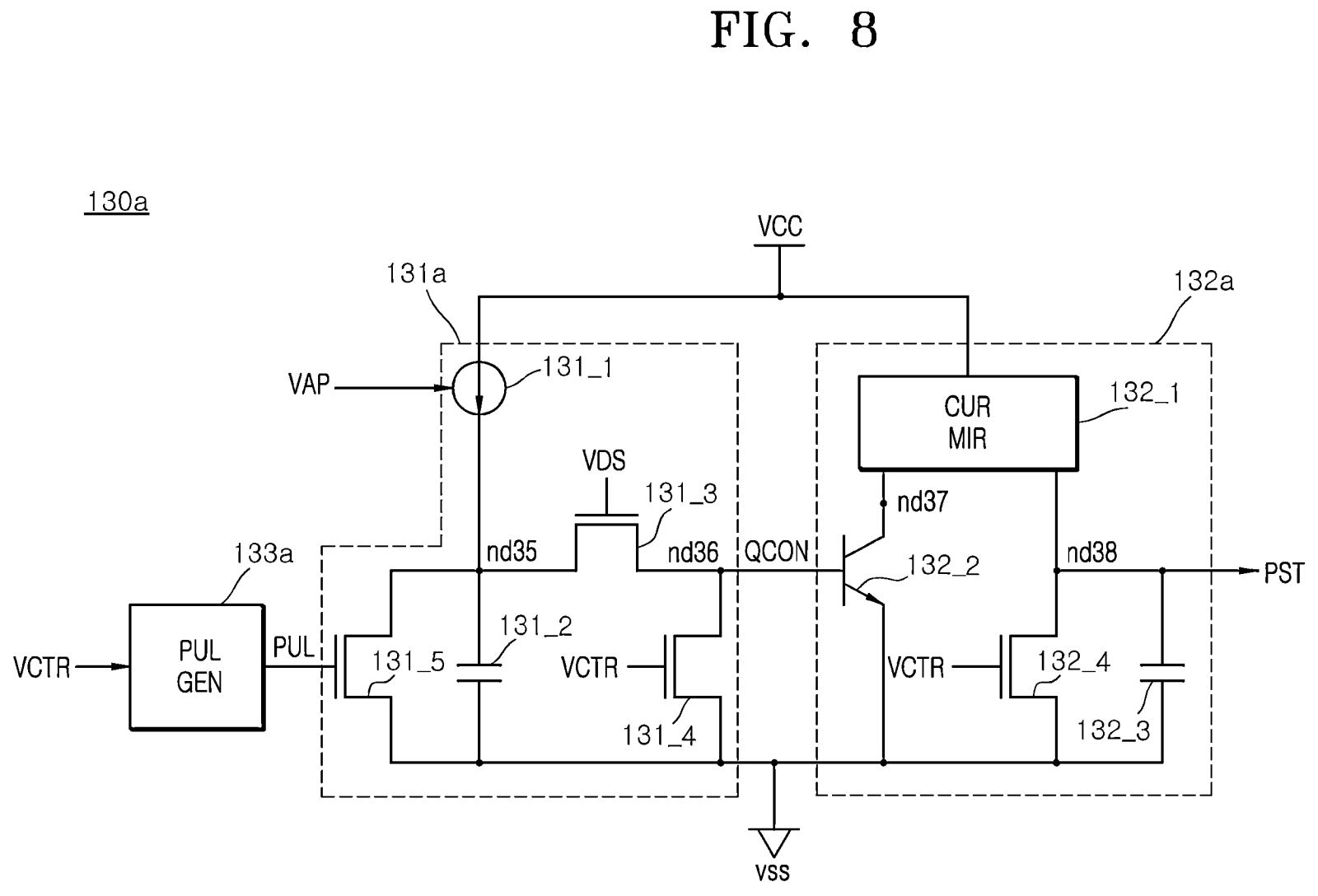

The timer 130a may generate the power-up start signal PST based on the external detection signal VAP, the discharge signal VDS, and the voltage control signal VCTR. The timer 130a may generate the power-up start signal PST that is enabled after a set time since the external detection signal VAP and the discharge signal VDS are enabled. The timer 130a may initiate the set time based on the voltage control signal VCTR after the power-up start signal PST is enabled. The set time may be set as the time for which a first capacitor 131_2 illustrated in FIG. 8 is charged with charges.

Figure 7:
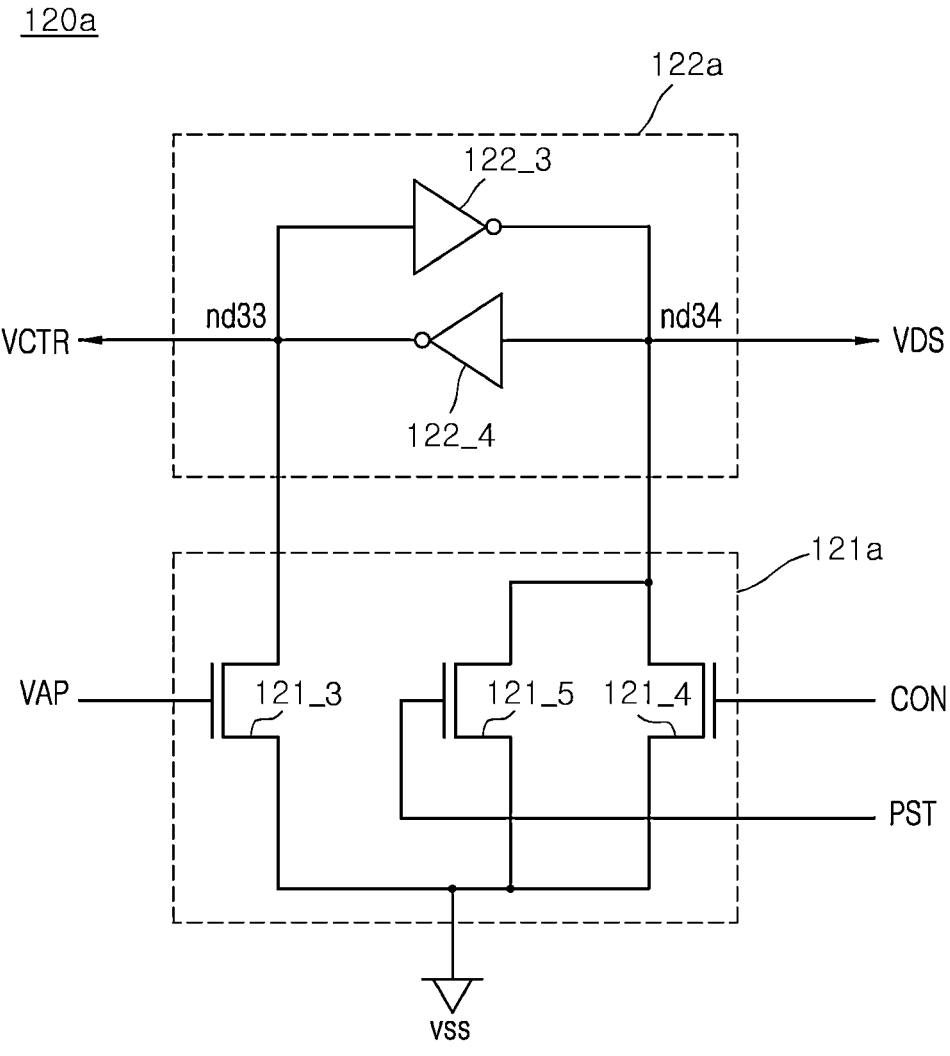
FIG. 7 is a diagram illustrating a construction according to an example of a voltage generation control circuit that is included in the level detection circuit illustrated in FIG. 6.

FIG. 7 is a circuit diagram illustrating a construction according to an example of the voltage generation control circuit 120a that is included in the level detection circuit 12a. The voltage generation control circuit 120a may include a pull-down driving circuit 121a and a latch circuit 122a.

The pull-down driving circuit 121a may include a first NMOS transistor 121_3 that is connected between a first node nd33 and the ground voltage VSS and that discharges the charges of the first node nd33 when the external detection signal VAP is enabled, a second NMOS transistor 121_4 that is connected between a second node nd34 and the ground voltage VSS and that discharges the charges of the second node nd34 when the control signal CON is enabled, and a third NMOS transistor 121_5 that is connected between the second node nd34 and the ground voltage VSS and that discharges the charges of the second node nd34 when the power-up start signal PST is enabled. The second NMOS transistor 121_4 and the third NMOS transistor 121_5 may be connected in parallel between the second node nd34 and the ground voltage VSS.

The latch circuit 122a may include a first inverter 122_3 that is connected between the first node nd33 and the second node nd34 and that generates the discharge signal VDS by inverting a voltage level of the first node nd33 and a second inverter 122_4 that is connected between the first node nd33 and the second node nd34 and that generates the voltage control signal VCTR by inverting a voltage level of the second node nd34.

FIG. 8 is a circuit diagram illustrating a construction according to an example of the timer 130a that is included in the level detection circuit 12a. The timer 130a may include a current supply circuit 131a, a power-up start signal generation circuit 132a, and a pulse signal generation circuit (PUL GEN) 133a.

The current supply circuit 131*a* may include a current source 131_1 that is connected between the external voltage VCC and a third node nd35, the first capacitor 131_2 that is connected between the third node nd35 and the ground voltage VSS and that stores charges supplied to the third node nd35, a fourth NMOS transistor 131_3 that is connected between the third node nd35 and a fourth node nd36 and that connects the third node nd35 and the fourth node nd36 when the discharge signal VDS is enabled, a fifth NMOS transistor 131_4 that is connected between the fourth node nd36 and the ground voltage VSS and that discharges the charges of the fourth node nd36 when the voltage control signal VCTR is enabled, and a sixth NMOS transistor 131_5 that is connected between the third node nd35 and the ground voltage VSS and that discharges the charges of the third node nd35 when a pulse signal PUL is enabled.

The current supply circuit 131*a* may supply charges from the external voltage VCC to the third node nd35 and the fourth node nd36 when the external detection signal VAP and the discharge signal VDS are enabled. The current supply circuit 131*a* may generate a current control signal QCON by supplying charges from the external voltage VCC to the third node nd35 and the fourth node nd36 when the external detection signal VAP and the discharge signal VDS are enabled. The current supply circuit 131*a* may set a set time by storing the charges of the third node nd35 in the first capacitor 131_2 when the external detection signal VAP is enabled. The set time may be set as the time from timing at which charges are supplied to the first capacitor 131_2 to the time when the amount of charges of the third node nd35 rises by a threshold voltage level of a current element 132_2 that is included in the power-up start signal generation circuit 132*a*. The current supply circuit 131*a* may generate the current control signal QCON by discharging the charges of the fourth node nd36 when the voltage control signal VCTR is enabled. The current supply circuit 131*a* may initiate the set time by discharging the charges of the third node nd35 when the pulse signal PUL is enabled.

The power-up start signal generation circuit 132*a* may include a current mirror (CUR MIR) 132_1 that is connected between the external voltage VCC, and a fifth node nd37 and a sixth node nd38, the current element 132_2 that is connected between the fifth node nd37 and the ground voltage VSS and that is turned on when the level of the current control signal QCON rises by a threshold voltage level, a second capacitor 132_3 that is connected between the sixth node nd38 and the ground voltage VSS and that stores charges supplied to the sixth node nd38, and a seventh NMOS transistor 132_4 that is connected between the sixth node nd38 and the ground voltage VSS and that discharges the charges of the sixth node nd38 when the voltage control signal VCTR is enabled.

The power-up start signal generation circuit 132*a* may supply charges from the external voltage VCC to the fifth node nd37 and the sixth node nd38 when the level of the current control signal QCON rises by a threshold voltage level of the current element 132_2. The power-up start signal generation circuit 132*a* may supply the sixth node nd38 with the same charges as charges that are supplied from the external voltage VCC to the fifth node nd37 when the level of the current control signal QCON rises by a threshold voltage level of the current element 132_2. The power-up start signal generation circuit 132*a* may generate the power-up start signal PST that is enabled to a logic high level, when the level of the current control signal QCON rises by a threshold voltage level of the current element 132_2. The power-up start signal generation circuit 132*a* may generate the power-up start signal PST that is disabled to a logic low level by discharging the charges of the sixth node nd38 when the voltage control signal VCTR is enabled.

The pulse signal generation circuit 133*a* may generate the pulse signal PUL based on the voltage control signal VCTR. The pulse signal generation circuit 133*a* may generate the pulse signal PUL that includes a pulse generated during a given interval, when the voltage control signal VCTR is enabled to a logic high level.

Figure 9:
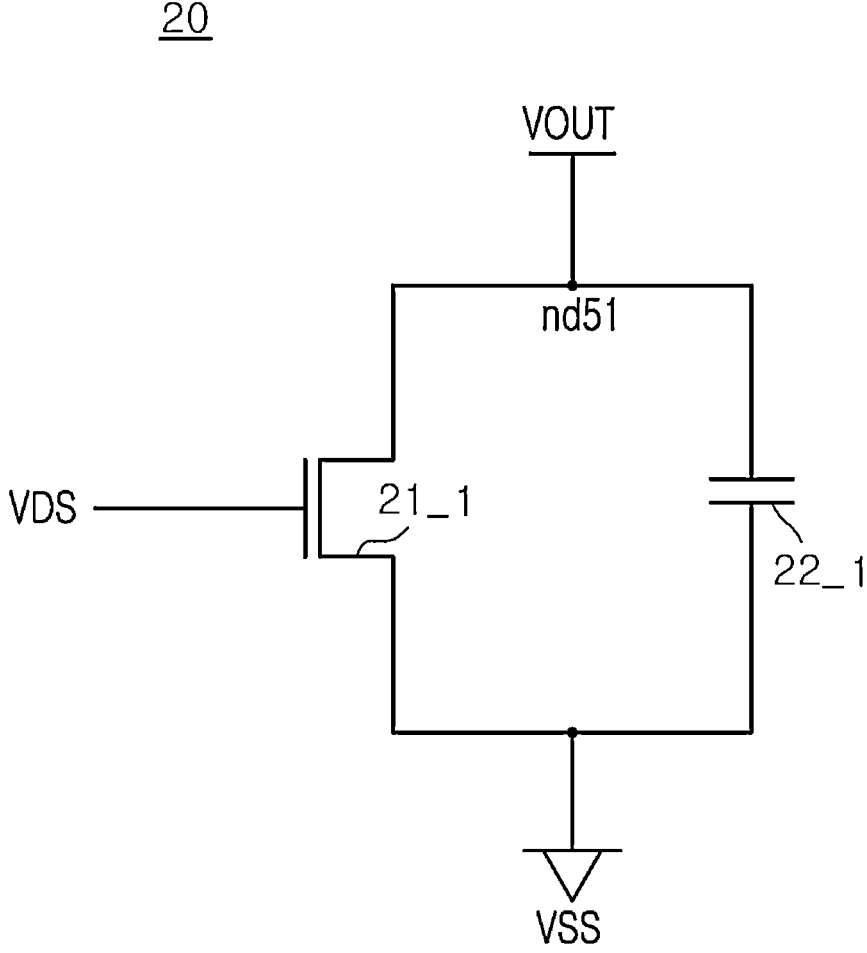
FIG. 9 is a circuit diagram illustrating a construction according to an example of a charge discharge circuit that is included in the semiconductor chip illustrated in FIG. 1.

FIG. 9 is a circuit diagram illustrating a construction according to an example of the charge discharge circuit 20 that is included in the semiconductor chip 1. The charge discharge circuit 20 may include the charge discharge element 21_1 and a capacitor 22_1.

The charge discharge element 21_1 may be connected between the output node nd51 from which the output voltage VOUT is generated and the ground voltage VSS, and may discharge the charges of the output node nd51 when the discharge signal VDS is enabled. The charge discharge element 21_1 may decrease the voltage level of the output voltage VOUT by discharging the charges of the output node nd51 when the discharge signal VDS is enabled.

The capacitor 22_1 may be connected between the output node nd51 from which the output voltage VOUT is generated and the ground voltage VSS. The capacitor 22_1 may store the charges supplied to the output node nd51.

The charge discharge element 21_1 and the capacitor 22_1 may be connected in parallel between the output node nd51 and the ground voltage VSS.

Figure 10:
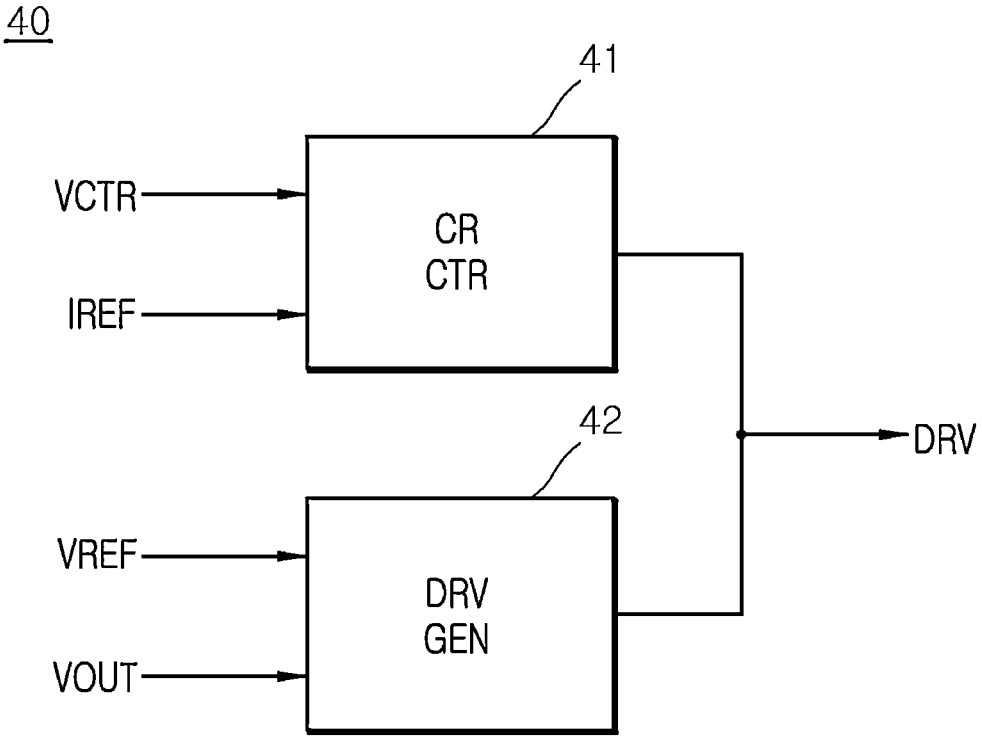
FIG. 10 is a block diagram illustrating a construction according to an example of a driving control circuit that is included in the semiconductor chip illustrated in FIG. 1.

FIG. 10 is a circuit diagram illustrating a construction according to an example of the driving control circuit 40 that is included in the semiconductor chip 1. The driving control circuit 40 may include a current control circuit (CR CTR) 41 and a driving signal generation circuit (DRV GEN) 42.

The current control circuit 41 may generate the driving signal DRV the voltage level of which is adjusted, based on the voltage control signal VCTR and the reference current IREF. The current control circuit 41 may generate the driving signal DRV the voltage level of which is decreased in response to the reference current IREF, during the interval in which the voltage control signal VCTR is enabled.

The driving signal generation circuit 42 may generate the driving signal DRV based on voltage levels of the output voltage VOUT and the reference voltage VREF. The driving signal generation circuit 42 may generate the driving signal DRV by comparing the output voltage VOUT and the reference voltage VREF.

Figure 11:
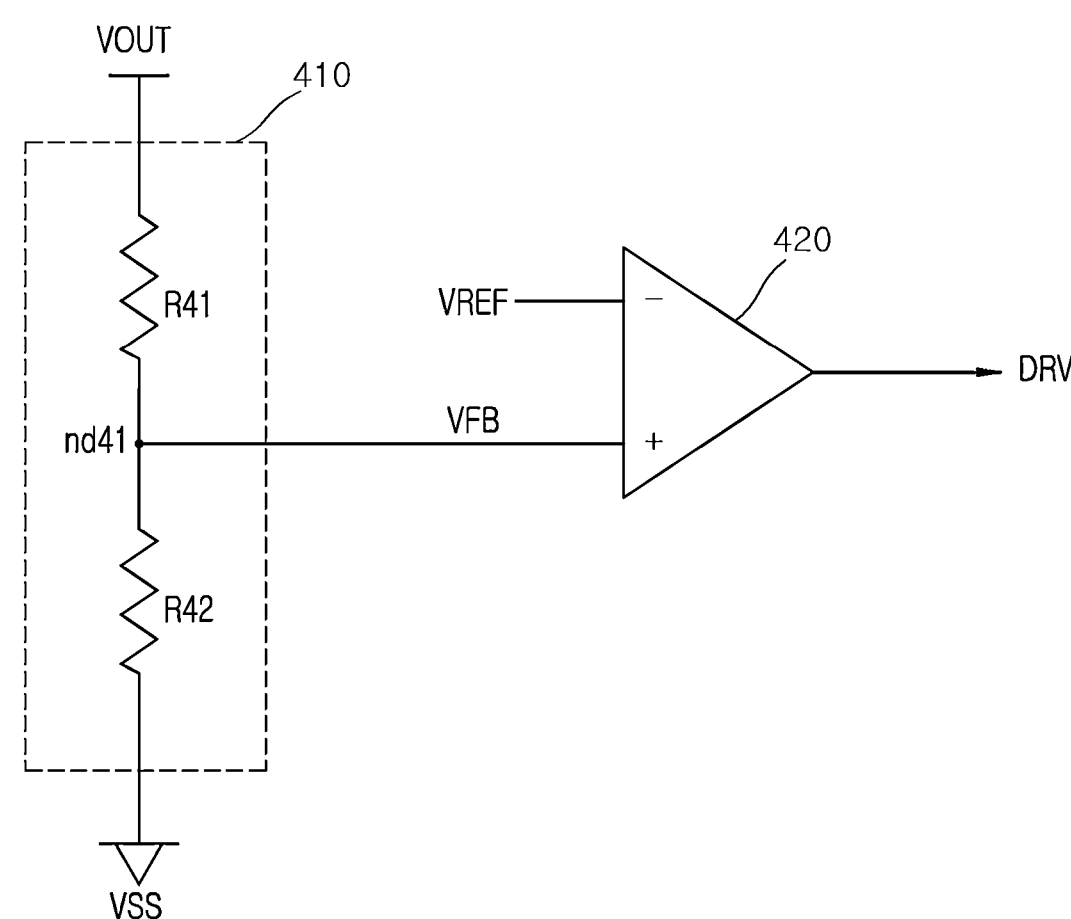
FIG. 11 is a diagram illustrating a construction according to an example of a driving signal generation circuit that is included in the driving control circuit illustrated in FIG. 10.

FIG. 11 is a diagram illustrating a construction according to an example of the driving signal generation circuit 42. The driving signal generation circuit 42 may include a voltage distribution circuit 410 and a comparator 420.

The voltage distribution circuit 410 may include a first resistor R41 that is connected between the output voltage VOUT and an eighth node nd41 and a second resistor R42 that is connected between the eighth node nd41 and the ground voltage VSS. The voltage distribution circuit 410 may generate a feedback voltage VFB distributed from the output voltage VOUT based on resistance values of the first resistor R41 and the second resistor R42 that are connected between the output voltage VOUT and the ground voltage VSS. The voltage distribution circuit 410 has been implemented to include the first resistor R41 and the second resistor R42, but may be implemented as a voltage distribution circuit in which various numbers of resistors are connected in series in a different embodiment. The resistance values of the first resistor R41 and the second resistor R42 may be variously set in different embodiments.

The comparator 420 may generate the driving signal DRV by comparing the feedback voltage VFB and the reference voltage VREF. The comparator 420 may generate the driving signal DRV that is disabled to a logic high level when the feedback voltage VFB is generated to have a voltage level equal to or greater than a voltage level of the reference voltage VREF. The comparator 420 may generate the driving signal DRV that is enabled to a logic low level when the feedback voltage VFB is generated to have a voltage level less than a voltage level of the reference voltage VREF.

Figure 12:
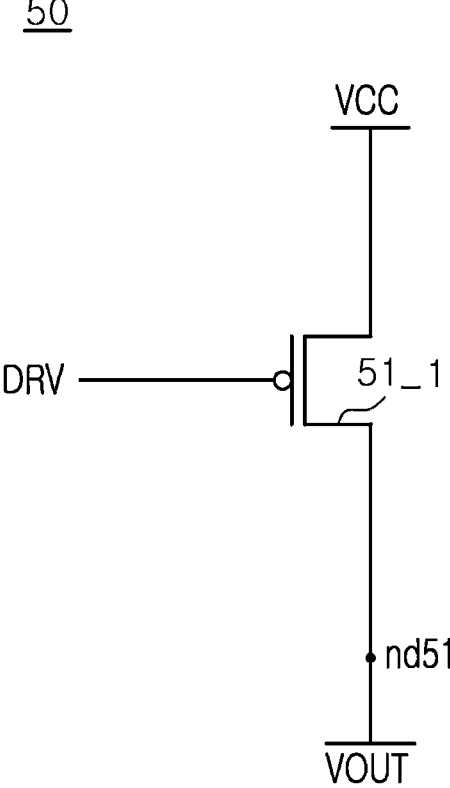
FIG. 12 is a circuit diagram illustrating a construction according to an example of a driving circuit that is included in the semiconductor chip illustrated in FIG. 1.

FIG. 12 is a circuit diagram illustrating a construction according to an example of the driving circuit 50 that is included in the semiconductor chip 1.

The driving circuit 50 may include a driving element 51_1 that is disposed between the external voltage VCC and the output node nd51 through which the output voltage VOUT is output, and may supply charges to the output node nd51 based on a voltage level of the driving signal DRV. The driving circuit 50 may generate the output voltage VOUT by supplying charges to the output node nd51 based on a voltage level of the driving signal DRV.

The driving element 51_1 may additionally increase the charges supplied to the output node nd51 as the voltage level of the driving signal DRV is decreased. The driving element 51_1 may be turned off when the driving signal DRV is disabled to a logic high level, and may block the charges supplied to the output node nd51. The driving element 51_1 may be turned off when the driving signal DRV having a logic high level is input to the gate of the driving element 51_1, and may block the charges supplied to the output node nd51. The driving element 51_1 may be turned on when the driving signal DRV is enabled to a logic low level, and may supply charges to the output node nd51. The driving element 51_1 may be turned on when the driving signal DRV having a logic low level is input to the gate of the driving element 51_1, and may supply charges to the output node nd51. The driving element 51_1 may be implemented as a PMOS transistor.

An operation of a test mode in which a power-up operation is repeatedly performed according to an embodiment of the present disclosure is described as follows with reference to FIG. 13.

The detection circuit 10 may generate the discharge signal VDS that is enabled to a logic high level when a voltage level of the external voltage VCC is greater than a first set level in the test mode.

The charge discharge element 21_1 of the charge discharge circuit 20 may discharge (IDIS) charges that are stored in the output node nd51 and the capacitor 22_1, during the interval in which the discharge signal VDS is enabled to a logic high level.

The detection circuit 10 may generate the voltage control signal VCTR that is enabled when the output voltage VOUT is generated to have a voltage level of the ground voltage VSS in the test mode.

The reference voltage generation circuit 30 may generate the reference voltage VREF, the reference current IREF, and the power reference voltage VR_PG based on the bandgap voltage VBG during the interval in which the enable signal VEN is enabled after the test mode is entered.

The driving control circuit 40 may generate the driving signal DRV the voltage level of which is decreased, based on the reference voltage VREF or the reference current IREF during the interval in which the voltage control signal VCTR is enabled.

The driving element 51_1 of the driving circuit 50 may increase with a greater driving force (ISUP) charges supplied from the external voltage VCC to the output node nd51 as the voltage level of the driving signal DRV is decreased. The driving element 51_1 of the driving circuit 50 may generate the output voltage VOUT the voltage level of which rises more as the charges supplied to the output node nd51 are increased (ISUP).

The comparison circuit 60 may generate the power-up signal VPG that is enabled when the output voltage VOUT is generated to have a voltage level equal to or greater than a voltage level of the power reference voltage VR_PG, during the interval in which the voltage control signal VCTR is enabled.

Figure 14:
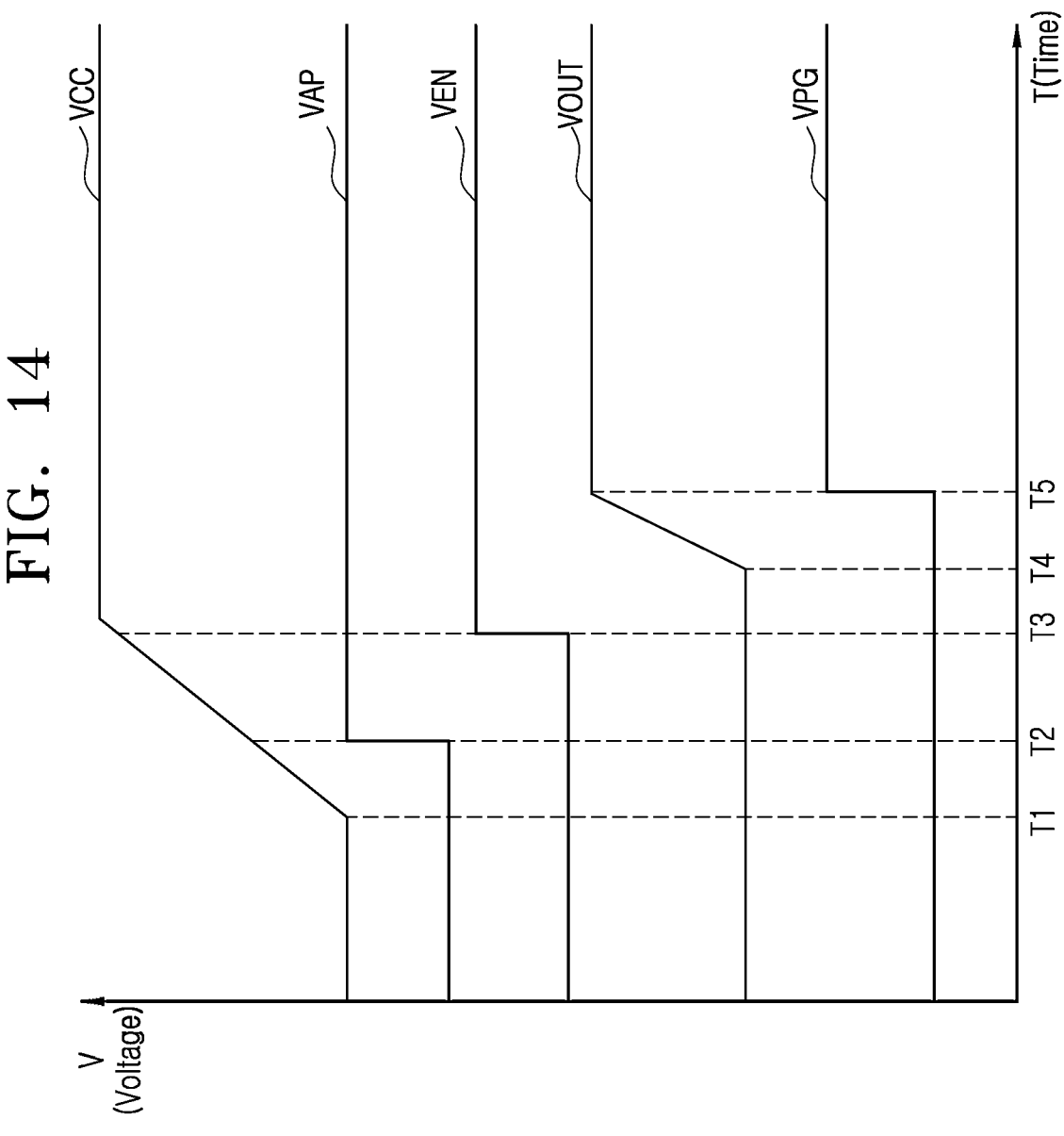
FIGS. 14 and 15 are timing diagrams for describing an operation of the semiconductor chip according to an embodiment of the present disclosure.

An operation of a test mode in which a power-up operation is repeatedly performed according to an embodiment of the present disclosure is described as follows with reference to FIG. 14.

At timing T1, when the test mode in which the power-up operation is performed is entered, the voltage level of the external voltage VCC may gradually rise.

At timing T2, the external voltage detection signal generation circuit 11 of the detection circuit 10 may generate the external voltage detection signal VAP that is enabled to a logic high level when the voltage level of the external voltage VCC is greater than a first set level.

At timing T3, the enable signal VEN is enabled to a logic high level after the test mode is entered. The reference voltage generation circuit 30 may generate the reference voltage VREF, the reference current IREF, and the power reference voltage VR_PG based on the bandgap voltage VBG during the interval in which the enable signal VEN is enabled after the test mode.

At timing T4, the driving control circuit 40 may generate the driving signal DRV the voltage level of which is decreased, based on the reference voltage VREF or the reference current IREF during the interval in which the voltage control signal VCTR is enabled. The driving circuit 50 may gradually raise the voltage level of the output voltage VOUT because the charges supplied from the external voltage VCC to the output node (nd51 in FIGS. 9 and 12) are increased more as the voltage level of the driving signal DRV is decreased.

At timing T5, the comparison circuit 60 may generate the power-up signal VPG that is enabled when the output voltage VOUT is generated to have a voltage level equal to or greater than a voltage level of the power reference voltage VR_PG having a second set level during the interval in which the voltage control signal VCTR is enabled.

The reliability of an internal voltage supplied to a semiconductor chip can be secured because the power-up signal VPG is generated after the voltage level of the external voltage VCC becomes a stable voltage level in the test mode in which such a power-up operation according to an embodiment of the present disclosure is performed.

Figure 15:
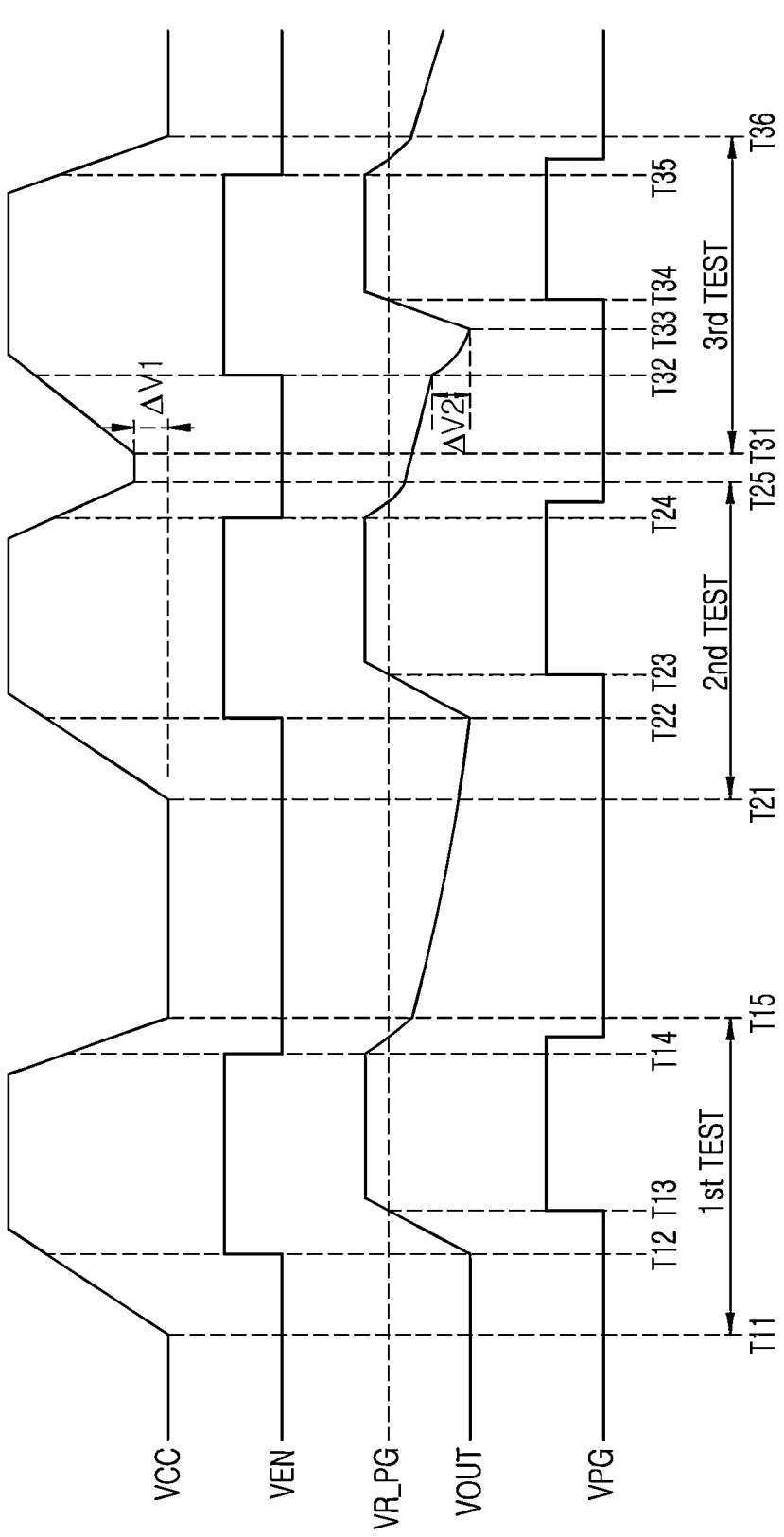

An operation of repeatedly performing a test mode in which a power-up operation is performed according to an embodiment of the present disclosure is described as follows with reference to FIG. 15.

At timing T11, when a test mode in which a power-up operation is performed is entered, the voltage level of the external voltage VCC may gradually rise. In this case, the test mode may be a first test mode (1st TEST).

At timing T12, after the test mode is entered, the enable signal VEN may be enabled to a logic high level. The detection circuit 10 may generate the voltage control signal VCTR that is enabled because the output voltage VOUT has a voltage level of the ground voltage VSS in the test mode. The reference voltage generation circuit 30 may generate the reference voltage VREF, the reference current IREF, and the power reference voltage VR_PG based on the bandgap voltage VBG during the interval in which the enable signal VEN is enabled after the test mode. The driving control circuit 40 may generate the driving signal DRV the voltage level of which is decreased, based on the reference voltage VREF or the reference current IREF during the interval in which the voltage control signal VCTR is enabled. The driving circuit 50 may gradually raise the voltage level of the output voltage VOUT because the charges supplied from the external voltage VCC to the output node (nd51 in FIGS. 9 and 12) are increased more as the voltage level of the driving signal DRV is decreased.

At timing T13, the comparison circuit 60 may generate the power-up signal VPG that is enabled when the output voltage VOUT is generated to have a voltage level equal to or greater than a voltage level of the power reference voltage VR_PG during the interval in which the voltage control signal VCTR is enabled.

At timing T14, when the first test mode is terminated, the voltage level of the external voltage VCC may be gradually decreased, and the enable signal VEN may be disabled to a logic low level. The driving circuit 50 may block the supply of the charges to the output node (nd51 in FIGS. 9 and 12). Accordingly, from timing T14, the charges of the output node (nd51 in FIGS. 9 and 12) may be gradually decreased, and the voltage level of the output voltage VOUT may be gradually decreased.

At timing T15, when the first test mode is terminated, the voltage level of the external voltage VCC may be decreased up to a voltage level of the ground voltage VSS.

At timing T21, when a test mode in which a power-up operation is performed is entered, a voltage level of the external voltage VCC may gradually rise. In this case, the test mode may be a second test mode (2nd TEST).

At timing T22, after the test mode is entered, the enable signal VEN may be enabled to a logic high level. The detection circuit 10 may generate the voltage control signal VCTR that is enabled because the output voltage VOUT has a voltage level of the ground voltage VSS in the test mode. The reference voltage generation circuit 30 may generate the reference voltage VREF, the reference current IREF, and the power reference voltage VR_PG based on the bandgap voltage VBG during the interval in which the enable signal VEN is enabled after the test mode. The driving control circuit 40 may generate the driving signal DRV the voltage level of which is decreased based on the reference voltage VREF or the reference current IREF during the interval in which the voltage control signal VCTR is enabled. The driving circuit 50 may gradually raise the voltage level of the output voltage VOUT because the charges supplied from the external voltage VCC to the output node (nd51 in FIGS. 9 and 12) are increased more as the voltage level of the driving signal DRV is decreased.

At timing T23, the comparison circuit 60 may generate the power-up signal VPG that is enabled when the output voltage VOUT is generated to have a voltage level equal to or greater than a voltage level of the power reference voltage VR_PG during the interval in which the voltage control signal VCTR is enabled.

At timing T24, when the second test mode is terminated, the voltage level of the external voltage VCC may be gradually decreased, and the enable signal VEN may be disabled to a logic low level. The driving circuit 50 may block the supply of the charges to the output node (nd51 in FIGS. 9 and 12). Accordingly, from timing T24, the charges of the output node (nd51 in FIGS. 9 and 12) may be gradually decreased, and the voltage level of the output voltage VOUT may be gradually decreased.

At timing T25, although the second test mode has been terminated, the external voltage VCC has a voltage level that is greater than the voltage level of the ground voltage VSS by a first remaining voltage ($\Delta V1$).

At timing T31, when a test mode in which a power-up operation is performed is entered, the voltage level of the external voltage VCC may gradually rise. In this case, the test mode may be a third test mode (3rd TEST).

At timing T32, after the test mode is entered, the enable signal VEN may be enabled to a logic high level. At this time, the output voltage VOUT has a voltage level that is greater than the voltage level of the ground voltage VSS by a second remaining voltage ($\Delta V2$). The reference voltage generation circuit 30 may generate the reference voltage VREF, the reference current IREF, and the power reference voltage VR_PG based on the bandgap voltage VBG during the interval in which the enable signal VEN is enabled after the test mode. The detection circuit 10 may generate the discharge signal VDS that is enabled when a voltage level of the external voltage VCC is greater than a first set level. The charge discharge circuit 20 may discharge the charges of the output node (nd51 in FIGS. 9 and 12) during the interval in which the discharge signal VDS is enabled. From timing T32, the voltage level of the output voltage VOUT may be gradually decreased.

At timing T33, the detection circuit 10 may generate the voltage control signal VCTR that is enabled when the output voltage VOUT is generated to have a voltage level of the ground voltage VSS in the test mode. The driving control circuit 40 may generate the driving signal DRV the voltage level of which is decreased, based on the reference voltage VREF or the reference current IREF during the interval in which the voltage control signal VCTR is enabled. The driving circuit 50 may gradually raise the voltage level of the output voltage VOUT because the charges supplied from the external voltage VCC to the output node (nd51 in FIGS. 9 and 12) are increased more as the voltage level of the driving signal DRV is decreased.

At timing T34, the comparison circuit 60 may generate the power-up signal VPG that is enabled when the output voltage VOUT is generated to have a voltage level equal to or greater than a voltage level of the power reference voltage VR_PG during the interval in which the voltage control signal VCTR is enabled.

At timing T35, when the third test mode is terminated, the voltage level of the external voltage VCC may be gradually decreased, and the enable signal VEN may be disabled to a logic low level. The driving circuit 50 may block the supply of the charges to the output node (nd51 in FIGS. 9 and 12). Accordingly, from timing T34, the charges of the output node (nd51 in FIGS. 9 and 12) may be gradually decreased, and the voltage level of the output voltage VOUT may be gradually decreased.

At timing T36, when the third test mode is terminated, the voltage level of the external voltage VCC may be decreased down to a voltage level of the ground voltage VSS.

Such a semiconductor chip 1 according to an embodiment of the present disclosure can prevent an error or mitigate errors in the generation of the power-up signal VPG in a way to generate the power-up signal VPG by raising the output voltage VOUT after discharging the charges of the output node (nd51 in FIGS. 9 and 12) when a test mode in which a power-up operation is repeatedly performed is performed.

Figure 16:
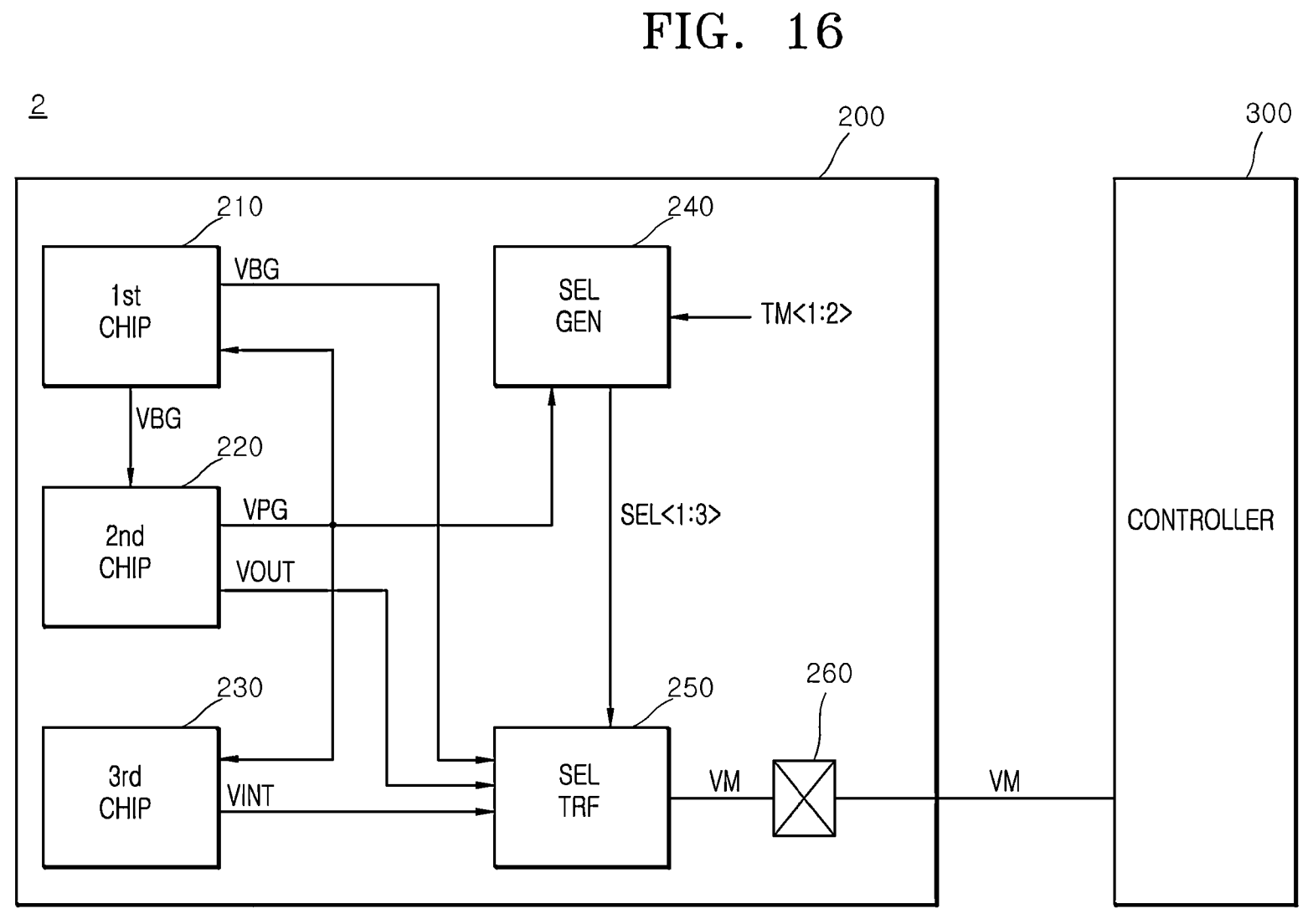

FIG. 16 is a block diagram illustrating a construction of a semiconductor system according to an embodiment of the present disclosure. As illustrated in FIG. 16, a semiconductor system 2 according to an embodiment of the present disclosure may include a semiconductor device 200 and a controller 300.

The semiconductor device 200 may include a first semiconductor chip (1$^{st}$ CHIP) 210, a second semiconductor chip (2$^{nd}$ CHIP) 220, a third semiconductor chip (3$^{rd}$ CHIP) 230, a selection signal generation circuit (SEL GEN) 240, a selection transfer circuit (SEL TRF) 250, and a monitoring pad 260.

The first semiconductor chip 210 may generate the bandgap voltage VBG having a constant voltage level. The first semiconductor chip 210 may output the bandgap voltage VBG to the selection transfer circuit 250 when the power-up signal VPG is enabled. The first semiconductor chip 210 may be implemented as a common bandgap voltage generator that generates the bandgap voltage VBG, that is, a criterion in order for the semiconductor device 200 to perform an operation.

The second semiconductor chip 220 may generate the output voltage VOUT and the power-up signal VPG in a test mode in which a power-up operation is repeatedly performed. The second semiconductor chip 220 may discharge the charges of the output node through which the output voltage VOUT is output until the voltage level of the output voltage VOUT is generated as the same voltage level as the ground voltage VSS. The second semiconductor chip 220 may increase the voltage level of the output voltage VOUT when the output voltage VOUT has the same voltage level as the ground voltage VSS. The second semiconductor chip 220 may generate the power-up signal VPG that is enabled when the voltage level of the output voltage VOUT is generated as a set level or greater. The second semiconductor chip 220 may output the output voltage VOUT to the selection transfer circuit 250 when the power-up signal VPG is enabled. The second semiconductor chip 220 may be implemented to have the same construction as the semiconductor chip 1 illustrated in FIGS. 1 to 12, and may perform the same operation as the semiconductor chip 1.

The third semiconductor chip 230 may generate an internal voltage VINT that is used to input and output data. The third semiconductor chip 230 may be implemented as a memory circuit that performs a normal operation for inputting and outputting data. The third semiconductor chip 230 may output the internal voltage VINT to the selection transfer circuit 250 when the power-up signal VPG is enabled.

The selection signal generation circuit 240 may generate first to third selection signals SEL<1:3> based on first and second test mode signals TM<1:2> when the power-up signal VPG is enabled. The selection signal generation circuit 240 may generate the first to third selection signals SEL<1:3> that are selectively enabled by decoding the first and second test mode signals TM<1:2> when the power-up signal VPG is enabled.

The selection transfer circuit 250 may output any one of the bandgap voltage VBG, the output voltage VOUT, and the internal voltage VINT as a monitoring voltage VM based on the first to third selection signals SEL<1:3>. The selection transfer circuit 250 may output the bandgap voltage VBG as the monitoring voltage VM when the first selection signal SEL<1> is enabled. The selection transfer circuit 250 may output the output voltage VOUT as the monitoring voltage VM when the second selection signal SEL<2> is enabled. The selection transfer circuit 250 may output the internal voltage VINT as the monitoring voltage VM when the third selection signal SEL<3> is enabled. The selection transfer circuit 250 may output the monitoring voltage VM to the controller 300 through the monitoring pad 260.

The semiconductor device 200 may output, as the monitoring voltages VM, voltages that are used in a test mode in which a power-up operation is performed and a normal mode, through the monitoring pad 260. The semiconductor device 200 has been implemented to include the first semiconductor chip 210, the second semiconductor chip 220, and the third semiconductor chip 230, but may be implemented to include various numbers of semiconductor chips in a different embodiment.

The controller 300 may detect normal operations of the first semiconductor chip 210, the second semiconductor chip 220, and the third semiconductor chip 230 by detecting the level of the monitoring voltage VM.

An operation of the semiconductor system according to an embodiment of the present disclosure is described as follows with reference to FIG. 17.

First, the first semiconductor chip 210 may generate the bandgap voltage VBG having a constant voltage level. The second semiconductor chip 220 may generate the output voltage VOUT and the power-up signal VPG in a test mode in which a power-up operation is performed. The third semiconductor chip 230 may generate the internal voltage VINT that is used to input and output data.

The selection signal generation circuit 240 may generate the level of the first selection signal SEL<1> as a logic high level H when the level of the first test mode signal TM<1> is a logic low level L and the level of the second test mode signal TM<2> is a logic high level H.

The selection transfer circuit 250 may output the bandgap voltage VBG as the monitoring voltage VM when the first selection signal SEL<1> is enabled to the logic high level H.

The controller 300 may detect a normal operation of the first semiconductor chip 210 by detecting the level of the monitoring voltage VM.

The selection signal generation circuit 240 may generate the level of the second selection signal SEL<2> as a logic high level H when the level of the first test mode signal TM<1> is a logic high level H and the level of the second test mode signal TM<2> is a logic low level L.

The selection transfer circuit 250 may output the output voltage VOUT as the monitoring voltage VM when the second selection signal SEL<2> is enabled to the logic high level H.

The controller 300 may detect a normal operation of the second semiconductor chip 220 by detecting the level of the monitoring voltage VM.

The selection signal generation circuit 240 may generate the level of the third selection signal SEL<3> as a logic high level H when the level of the first test mode signal TM<1> is a logic high level H and the level of the second test mode signal TM<2> is a logic high level H.

The selection transfer circuit 250 may output the internal voltage VINT as the monitoring voltage VM when the third selection signal SEL<3> is enabled to the logic high level H.

The controller 300 may detect a normal operation of the third semiconductor chip 230 by detecting the level of the monitoring voltage VM.

Such a semiconductor system 20 according to an embodiment of the present disclosure can prevent an error or mitigate errors in the generation of the power-up signal VPG in a way to generate the power-up signal VPG by raising the output voltage VOUT after discharging the charges of the output node when a test mode in which a power-up operation is performed is repeatedly performed. The semiconductor system 20, in an embodiment, can detect normal operations of the semiconductor chips by outputting, as the monitoring voltages VM, internal voltages used in a test mode and a normal mode after the power-up signal VPG is generated and detecting the voltage levels of the monitoring voltages VM.

Figure 18:
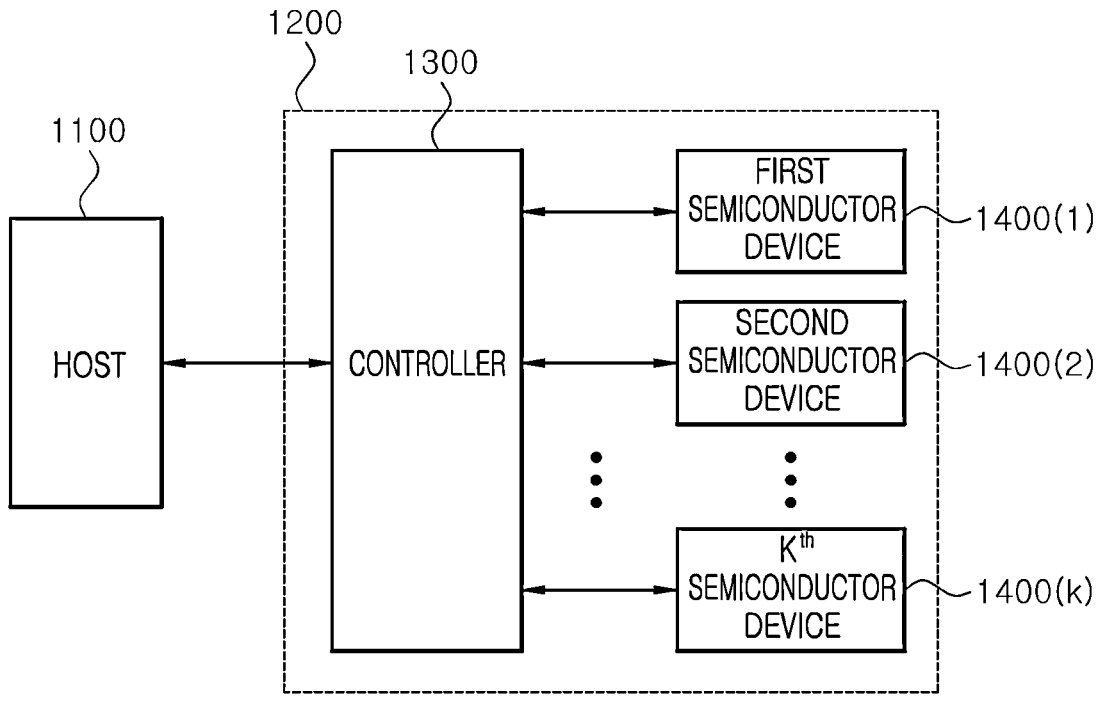
FIG. 18 is a diagram illustrating a construction according to an example of an electronic system to which the semiconductor chip and the semiconductor system illustrated in FIGS. 1 to 17 have been applied.

FIG. 18 is a block diagram illustrating a construction according to an embodiment of an electronic system 1000 according to an embodiment of the present disclosure. As illustrated in FIG. 15, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB), etc.

The semiconductor system 1200 may include a controller 1300 and semiconductor devices 1400(K:1). The controller 1300 may control the semiconductor devices 1400(K:1) so that the semiconductor devices 1400(K:1) perform a test mode and a normal mode. Each of the semiconductor devices 1400(K:1), in an embodiment, can secure the reliability of an internal voltage that is supplied to a semiconductor chip by generating the power-up signal VPG after the voltage level of the external voltage VCC becomes a stable voltage level in the test mode. Each of the semiconductor devices 1400(K:1), in an embodiment, can prevent an error or mitigate errors in the generation of the power-up signal VPG in a way to generate the power-up signal VPG by raising the output voltage VOUT after discharging the charges of the output node when the test mode in which a power-up operation is performed is repeatedly performed. Each of the semiconductor devices 1400(K:1), in an embodiment, can prevent an error or mitigate errors in the generation of the power-up signal VPG in a way to generate the power-up signal by discharging the charges of the output node when the test mode is performed and performing a power-up operation after a set time. Each of the semiconductor devices 1400(K:1), in an embodiment, may output, as the monitoring voltages VM, internal voltages that are used in a test mode and a normal mode after the power-up signal VPG is generated. In an embodiment, the controller 1300 may detect normal operations of the semiconductor devices 1400(K:1) by detecting the voltage levels of the monitoring voltages VM that are output by the semiconductor devices 1400(K:1).

Figure 13:
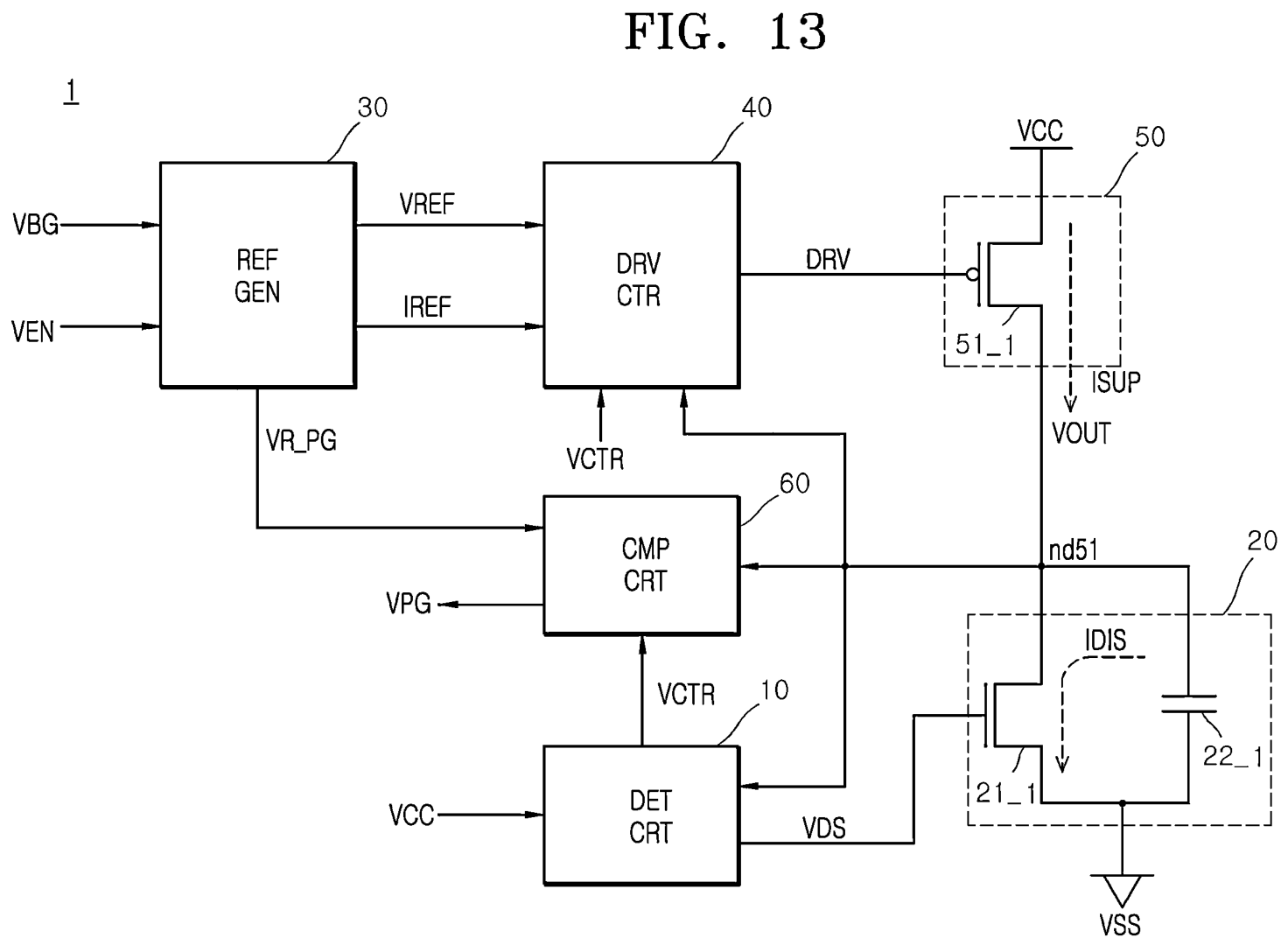

The controller 1300 may be implemented as the controller 300 illustrated in FIG. 13. Each of the semiconductor devices 1400(K:1) may be implement as the semiconductor device 200 illustrated in FIG. 13. Each of the semiconductor devices 1400(K:1) may be implemented as one of dynamic random access memory (DRAM), phase change random access memory (PRAM), resistive random access memory (RRAM), magnetic random access memory (MRAM), and ferroelectric random access memory (FRAM) in a different embodiment.

What is claimed is:

1. A semiconductor chip comprising:
a driving circuit configured to increase an output voltage on an output node in response to a driving signal;
a charge discharge circuit configured to discharge charges accumulated on the output node in response to a discharge signal;

a detection circuit configured to generate the discharge signal and a voltage control signal; and
a driving control circuit configured to, when a level of an external power supply voltage becomes greater than a first set level, enable the driving signal based on the voltage control signal,
wherein, when the detection circuit determines that the charges of the output node are sufficiently discharged, the detection circuit disables the discharge signal to control the charge discharge circuit to be disabled and enables the voltage control signal in response to the disabled discharge signal, and
wherein the driving control circuit enables the driving signal, based on the enabled voltage control signal, to control the driving circuit to increase the output voltage according to the external power supply voltage.

2. The semiconductor chip of claim 1, wherein the driving control circuit is configured to generate the driving signal by comparing a reference voltage and a voltage generated by dividing the output voltage.

3. The semiconductor chip of claim 1, wherein the charge discharge circuit includes a nmos transistor connected to the output node and controlled by the discharge signal.

4. The semiconductor chip of claim 1, wherein the driving circuit includes a pmos transistor connected to the output node and controlled by the driving signal.

5. The semiconductor chip of claim 1, wherein the detection circuit determines that the charges of the output node are sufficiently discharged when the level of the output voltage reaches a ground voltage level.

6. A semiconductor chip comprising:
a driving circuit configured to increase an output voltage on an output node;
a charge discharge circuit configured to discharge charges accumulated on the output node; and
a detection circuit configured to detect a level of the output voltage and to generate the discharge signal and a voltage control signal based on the detecting;
wherein, when the detection circuit detects that the level of the output voltage reaches a set level, the detection circuit controls the charge discharge circuit to stop discharging the charges accumulated on the output node and controls the driving circuit to increase the output voltage on the output node according to an external power supply voltage.

7. The semiconductor chip of claim 6, wherein the charge discharge circuit includes a nmos transistor connected to the output node and controlled by the detection circuit.

8. The semiconductor chip of claim 6, wherein the driving circuit includes a pmos transistor connected to the output node and controlled by the detection circuit.

9. A semiconductor chip comprising:
a driving circuit configured to increase an output voltage on an output node in response to a driving signal;
a charge discharge circuit configured to discharge charges accumulated on the output node in response to a discharge signal;
a detection circuit configured to generate the discharge signal and a voltage control signal based on the detecting; and
a driving control circuit configured to generate the driving signal,
wherein, when the detection circuit determines that the charges of the output node are sufficiently discharged, the detection circuit disables the discharge signal to control the charge discharge circuit to be turned-off and enables the voltage control signal in response to the disabled discharge signal, and wherein, when a level of an external power supply voltage becomes greater than a second set level, the driving control circuit enables the driving signal, in response to the enabled voltage control signal, to control the driving circuit to increase the output voltage according to the external power supply voltage.

10. The semiconductor chip of claim 9, wherein the driving control circuit is configured to generate the driving signal by comparing a reference voltage and a voltage generated by dividing the output voltage.

11. The semiconductor chip of claim 9, wherein the charge discharge circuit includes a nmos transistor connected to the output node and controlled by the discharge signal.

12. The semiconductor chip of claim 9, wherein the driving circuit includes a pmos transistor connected to the output node and controlled by the driving signal.

13. The semiconductor chip of claim 9, wherein the detection circuit determines that the charges of the output node are sufficiently discharged when the level of the output voltage reaches a ground voltage level.

14. An operating method of a semiconductor chip, comprising:

detecting that a level of an external power supply voltage increases greater than a first set level;

discharging charges accumulated on a output node after the detecting;

determining that the charges of the output node are sufficiently discharged;

stopping the discharging of the charges accumulated on the output node based on the determining; and starting to increase the voltage of the output node after the stopping according to the external power supply voltage.

*    *    *    *    *